US009494865B2

(12) United States Patent
Hinestroza et al.

(10) Patent No.: US 9,494,865 B2
(45) Date of Patent: Nov. 15, 2016

(54) MICROSCOPICALLY STRUCTURED POLYMER MONOLITHS AND FABRICATION METHODS

(75) Inventors: Juan P Hinestroza, Ithaca, NY (US); Huaning Zhu, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 981 days.

(21) Appl. No.: 13/520,038

(22) PCT Filed: Dec. 31, 2010

(86) PCT No.: PCT/US2010/062625
§ 371 (c)(1), (2), (4) Date: Dec. 17, 2012

(87) PCT Pub. No.: WO2011/142788
PCT Pub. Date: Nov. 17, 2011

(65) Prior Publication Data

US 2013/0098835 A1 Apr. 25, 2013

Related U.S. Application Data

(60) Provisional application No. 61/291,461, filed on Dec. 31, 2009.

(51) Int. Cl.

| | |
|---|---|
| ***G03F 7/26*** | (2006.01) |
| ***G03F 7/20*** | (2006.01) |
| ***B01D 39/16*** | (2006.01) |
| ***B01D 67/00*** | (2006.01) |
| ***B01D 71/26*** | (2006.01) |
| ***G03F 7/00*** | (2006.01) |
| *B01L 3/00* | (2006.01) |

(52) U.S. Cl.
CPC ................ *G03F 7/20* (2013.01); *B01D 39/16* (2013.01); *B01D 39/1692* (2013.01); *B01D 67/0034* (2013.01); *B01D 71/26* (2013.01); *G03F 7/0015* (2013.01); *B01D 2325/08* (2013.01); *B01L 3/502707* (2013.01); *B01L 3/502753* (2013.01)

(58) Field of Classification Search
CPC ........................................................ G03F 7/26
See application file for complete search history.

(56) References Cited

U.S. PATENT DOCUMENTS

| | | | |
|---|---|---|---|
| 6,861,006 B2 | 3/2005 | Ferain et al. | |
| 2003/0029787 A1 | 2/2003 | Liu et al. | |
| 2003/0207099 A1 | 11/2003 | Gillmor et al. | |
| 2005/0263452 A1 | 12/2005 | Jacobson | |
| 2005/0287815 A1* | 12/2005 | Lai et al. | 438/710 |
| 2008/0041818 A1 | 2/2008 | Kihara et al. | |

FOREIGN PATENT DOCUMENTS

JP 63004205 A 1/1988

OTHER PUBLICATIONS

Y.Y. Li, F.Cunin, J.R. Link, T. Cao, R.E. Belts, and S.H. Reiver, “Polymer Replicas of Photonic Porous Silicon for Sensing and Drug Delivery Applications”, Science vol. 299, 2003, 2045-2047.

S.Y. Chou, P.R. Krauss, P.J. Renstrom, “Imprint of sub-25 nm Vias and Trenches in Polymers” Appl. Phys. Lett. vol. 67, Nov. 20, 1995, pp. 3114-3116.

F. Gottschalch, T. Hoffman, C.M.S. Torres, H. Schulz, H.C. Scheer, “Polymer Issues in Nanoimpinting Technique”, Solid-State Electronics, 1999, vol. 43, pp. 1079-1083.

Y. Xia, G.M. Whitesides, “Soft Lithography”, Annu. Rev. Mater. Science vol. 28, 1998, pp. 153-184.

V.V. Kancharla, S. Chen, “Fabrication of Biodegradable Polymeric Micro-Devices Using Laser Micromachining”, Biomed. Microdev. vol. 4, May 2002, pp. 105-109.

W. Yan, V.K.S.Hsiao, Y.B. Zheng, Y.M. Shariff, T. Gao, T.J. Huang, “Towards Nonporous Polymer Thin Film-Based Drug Delivery Systems”, Thin Solid Films vol. 517, 2009, pp. 1794-1798.

D. Gopalani, S. Kumar, A.S. Jodha, R. Singh, P.K. Khatri and R. Gopal, “A Novel Method for Production of Polyester Films-Based Nuclear Track Microfilters”, J. Membrane Sci. vol. 178, 2000, pp. 93-98.

E. Ferain and R. Legras, “Efficient Production of Nanoporous Particle Track Etched Membranes with Controlled Properties”, Radiation Measurements vol. 34, 2001, pp. 585-588.

I.M Yamazaki, R. Paterson, and L.P. Geraldo, “A New Generation of Track Etched Membranes for Microfiltration and Ultrafiltration: Part I. Preparation and Characterisation”, J. Membrane Sci. vol. 118, 1996, pp. 239-245.

P. Apel, “Track Etching Technique in Membrane Technology”, Radiation Measurements vol. 34, 2001, pp. 559-566.

Y. Lu, S.C. Chen, “Micro and Nano-Fabrication of Biodegradable Polymers for Drug Delivey”, Advanced Drug Delivery Reviews vol. 56, 2004, pp. 1621-1633.

Y. Zhan, E.A. Matsumoto, A. Peter, P.C. Lin, R.D. Kamien, and S. Yang, “One-Step Nanoscale Assembly of Complex Structures via Harnessing of an Elastic Instability”, Nano Letters vol. 8, 2008, pp. 1192-1196.

J. Kim, W.J. Jasper, J.P. Hinestroza, “Charge Characterization of an Electrically Charged Fiber Via Electrostatic Force Microscopy”, Journal of Engineered Fibers and Fabrics vol. 1, 2006, pp. 30-46.

(Continued)

*Primary Examiner* — Kathleen Duda
(74) *Attorney, Agent, or Firm* — Heslin Rothenberg Farley & Mesiti P.C.

(57) ABSTRACT

Novel polymer monolith structures and methods for fabrication of the same are disclosed in a variety of embodiments. In an illustrative embodiment, a method includes forming a pattern of features on a wafer, thereby forming a patterned wafer; forming a polymer layer on the patterned wafer; using a first plasma to remove at least a portion of the polymer layer; and using a second plasma to etch off at least a portion of the pattern of features, thereby providing a structured polymer monolith. The pattern of features may include an array of pillars. Providing the structured polymer monolith may include providing a structured polymer monolith filter having an array of channels formed by the pillars. The structured polymer monolith may be composed of polypropylene.

14 Claims, 14 Drawing Sheets

(56) References Cited

OTHER PUBLICATIONS

J. Kim, W. Jasper, J. Hinestroza, "Direct Probing of Solvent Induced Charge Degradation in Polypropylene Electret Fibres Via Electrostatic Force Microscopy", Journal of Microscopy vol. 225, Jan. 2007, pp. 72-79.
E. Lock, S. Walton and R. Fernsler, "Preparation of Ultra Thin Polystyrene, Polypropylene and Polyethylene Films on Si Substrate Using Spin Coating Technology", Naval Research Laboratory Report, Jan. 4, 2008, NRL/MR/6750--8-9092.
T. Chittrakarn, T. Bhongsuwan, P. Wanichapichart, P. Nuanuin, S. Chongkum, A. Khonduangkaew, and S. Bordeepong, "Nuclear Track-Etched Pore Membrane Production Using Neutrons From the Thai Research Reactor TRR-1/M1", Songklanakarin J. Sci. Technol. vol. 24, 2002, pp. 863-870.
S. Abuzeid, A.A. Busnaina, and G. Ahmadi, "Wall Deposition of Aerosol Particles in a Turbulent Channel Flow", J. Aerosol Sci. vol. 22, 1991, pp. 43-62.
S. Ansumali and I.V. Karlin, "Kinetic Boundary Conditions in the Lattice Boltzmann Method", Phys. Rev. E vol. 66 026311, 2002.
D. Burnett, "The Distribution of Velocities and Mean the Motion in a Nonuniform Gas", Prod. London Math, Soc. vol. 39, Nov. 15, 1934, pp. 382-435.
Y.H. Cao, C.S. Cheung and Z.D. Yan, "Numerical Study of an Electret Filter Composed of an Array of Staggered Parallel Rectangular Split-Type Fibers", Aerosol Science and Technology vol. 38, 2004, pp. 603-618.
S. Chen, H. Chen, D. Martinez, and W. Matthaeus, "Lattice Boltzmann Model for Simulation of Magnetohydrodynamics", Phys. Rev. Lett. vol. 67, Dec. 30, 1991, pp. 3776-3779.
S. Chen, G.D. Doolen, "Lattice Boltzmann Method for Fluid Flows", Ann. Rev. Fluid Mech., vol. 30, 1998, pp. 329-364.
S. Chen, C.S. Cheung, C.K. Chan, and C. Zhu, "Numerical Simulation of Aerosol Collection in Filters with Staggered Parallel Rectangular Fibres", Compunctual Mechanics vol. 28, 2002, pp. 152-161.
B. Fardi and B.Y.H. Liu, "Flow Field and Pressure Drop of Filters with Rectangular Fibers", Aerosol Science and Technology vol. 17, 1992, pp. 36-44.
B. Fardi and B.Y.H. Liu, "Efficiency of Fibrous Filters with Rectangular Fibers", Aerosol Science and Technology vol. 17, 1992, pp. 45-58.
M. Gad-El-Hak, "The Fluid Mechanics of Microdevices—The Freeman Scholar Lecture", Trans. ASME, J. Fluids Engineering vol. 121, Mar. 1999, pp. 5-33.
W.D. Iwan and A.B. Mason, Jr., "Equivalent Linearization for Systems Subjected to Non-Stationary Random Excitation", Int. J. Non-Linear Mech. vol. 15, 1980, pp. 71-82.
S.C. Kim, M.S. Harrington and D.Y.H. Pui, "Experimental Study of Nanoparticles Penetration Though Commercial Filter Media", Journal of Nanoparticle Research vol. 9, 2007, pp. 117-125.
M. Kim and A.L. Zydney, "Effect of Electrostatic, Hydrodynamic, and Brownian Forces on Particle Trajectories and Sieving in Normal Flow Filtration", J. Colloid and Interface Sci. vol. 269, 2004, pp. 425-431.
M. Kim and A.L. Zydney, "Theoretical Analysis of Particle Trajectories and Sieving in a Two-Dimensional Cross-Flow Filtration System", J. Membr. Sci. vol. 281, 2006, 666-675.
M. Ouyang and B.Y.H. Liu, "Analytical Solution of Flow Field and Pressure Drop for Filters with Rectangular Fibers", J. Aerosol Sci. vol. 29, 1998, pp. 187-196.
G. Oberdorster, A. Maynard, K. Donaldson, V. Castranova, J. Fizpatrick, K. Ausman, J. Carter, B. Karn, W. Kreyling, D. Lai, S. Olin, N. Monteiro-Riviere, D. Warheit, H. Yang, "Principles for Characterizing the Potential Human Health Effects from Exposure to Nanomaterials: Elements of a Screening Strategy", Particle and Fibre Toxicology vol. 2, Oct. 6, 2005.
I.I. Orabi and G. Ahmadi, "Nonstationary Response Analysis of a Duffing Oscillator by the Wiener-Hermite Expansion Method", J. Appl. Mech. vol. 54, Jun. 1987, pp. 434-440.
Y.H. Qian, D. D'Humieres, and P. Lallemand, "Lattice BGK Models for Navier-Stokes Equation", Europhys. Lett. vol. 17, Jan. 1992, pp. 479-484.
V. Sofonea and R.F. Sekerka, "Boundary Conditions for the Upwind Finite Difference Lattice Boltzmann Model: Evidence of Slip Velocity in Micro-Channel Flow", J. Comp. Phys. vol. 207, 2005, pp. 639-659.
Y. Sone, "Kinetic Theory and Fluid Dynamics", Birkhauser, Boston, 2002.
J. Wang and D.Y.H. Pui, "Filtration of Aerosol Particles by Elliptical fibers: A Numerical Study", Journal of Nanoparticle Research vol. 11, 2009, pp. 185-196.
M. Wu, A.V. Kuznetsov, and W.J. Jasper, "Modeling of Particle Trajectories in an Electrostatically Charged Channel", Physics of Fluids vol. 22, 2010.
K.M. Yun, C.J. Hogan, Jr., Y. Matsubayashi, M. Kawabe, F. Iskandar, K. Okuyama, "Nanoparticle Filtration by Electrospun Polymer Fibers", Chemical Engineering Science vol. 62, 2007, pp. 4751-4759.
C. Zhu, C.H. Lin, and C.S. Cheung, "Inertial Impaction-Dominated Fibrous Filtration with Rectangular or Cylindrical Fibers", Powder Technology vol. 112, 2000, pp. 149-162.
H. Zhu and J.P. Hinestroza, "Collection Efficiency for Filters with Staggered Parallel Y and Triple Y Fibers: A Numerical Study", Journal of Engineered Fibers and Fabrics vol. 4, 2009, pp. 16-25.
F.R. Zypmana, "Off-Axis Electric Field of a Ring of Charge", Am. J. Phys. vol. 74, Apr. 2006, pp. 295-300.
International Search Report for PCT/US2010/062625, dated Dec. 28, 2011.

* cited by examiner

MICROSCOPICALLY STRUCTURED POLYMER MONOLITHS AND FABRICATION METHODS

CROSS REFERENCE TO RELATED APPLICATIONS

This application is a National Stage application under 35 U.S.C. §371 of PCT Application No. PCT/US2010/062625, filed Dec. 31, 2010, entitled "Microscopically Structured Polymer Monoliths and Fabrication Methods," which claims priority to U.S. Application No. 61/291,461, filed Dec. 31, 2009 entitled "Fabrication of Polypropylene Monolith Filters Using Photolithography and Spin Coating Techniques," the entirety of which is incorporated by reference herein.

STATEMENT REGARDING FEDERALLY FUNDED RESEARCH OR DEVELOPMENT

This invention was made with government support under grant number HDTRA1-08-1-001 awarded by the United States Defense Threat Reduction Agency (DTRA). The United States Government has certain rights in the invention.

FIELD

The invention relates in general to microscopically structured monoliths and particularly to a monolith filter and a method for making a monolith filter.

BACKGROUND

Filtration processes have been widely used in industry to eliminate contaminants from the air or liquids. Traditional filters are mainly comprised of fibrous media where aerosols flow in the exterior space of fibers.

The discussion above is merely provided for general background information and is not intended to be used as an aid in determining the scope of the claimed subject matter.

SUMMARY

Novel polymer monolith structures and methods for fabrication of the same are disclosed in a variety of embodiments. In an illustrative embodiment, a method includes forming a pattern of features on a wafer, thereby forming a patterned wafer; forming a polymer layer on the patterned wafer; using a first plasma to remove at least a portion of the polymer layer; and using a second plasma to etch off at least a portion of the pattern of features, thereby providing a structured polymer monolith. The pattern of features may include an array of pillars. Providing the structured polymer monolith may include providing a structured polymer monolith filter having an array of channels formed by the pillars. The structured polymer monolith may be composed of polypropylene.

This Summary is intended only to provide a brief overview of subject matter disclosed herein according to one or more illustrative embodiments, and does not serve as a guide to interpreting the claims or to define or limit the scope of the invention, which is defined only by the appended claims. This Summary is provided to introduce an illustrative selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

For a further understanding of the objects of the various illustrative embodiments, reference will be made to the following detailed description which is to be read in connection with the accompanying drawings.

The drawings are not necessarily to scale, emphasis instead generally being placed upon illustrating the principles of various embodiments. In the drawings, like numerals are used to indicate like parts throughout the various views.

DETAILED DESCRIPTION OF ILLUSTRATIVE EMBODIMENTS

Set forth herein are novel polymer monolith structures such as monolith filters and methods for fabricating polymer monolith structures, in accordance with a variety of embodiments. Filtration processes have been widely utilized in industry to eliminate contaminants from gas or liquid streams. A monolith filter is very different from and inherently more effective than a traditional filter made of a fiber-based material. Fiber-based filters typically feature a more or less random arrangement of fibers, where a and rely on probabilistic capture of target particles in an aerosol or fluid flowing through the exterior spaces between the randomly arranged fibers. In sharp contrast, a polymeric thin film monolith filter of the present disclosure may be precisely designed and precision-made on a microscopic or nanoscopic scale using advanced manufacturing techniques. When an aerosol or fluid flows through a monolith filter, the target particles can be captured either on an outer surface of the polymer film monolith or on the inner surfaces of the channels. A polymer monolith filter may also have an electrostatic charge applied to various surfaces thereof to aid in precision filtration. An electrostatic charge may be applied to the filter surfaces which can polarize uncharged particles in the flow field, creating electrostatic attractive forces between the particles and the surfaces of the monolith. In an illustrative embodiment directed to a polypropylene monolith filter, polypropylene monolith filters may therefore feature improved filtration effectiveness for nanoparticles.

In various illustrative embodiments, a monolith filter may be fabricated using both photolithography and spin-coating techniques. For example, in an illustrative embodiment, a method may enable fabrication of a polypropylene monolith filter comprising an array of micron-sized channels, using photolithography and spin-coating techniques, as set forth as follows for this illustrative embodiment. First, photolithography techniques may be employed to make an array of micron-sized pillars on a silicon wafer, followed by spin-coating of polypropylene solutions onto the patterned wafer. Photolithography procedures can include spin-coating photoresist on a silicon wafer, shining UV light through a photomask decorated with prescribed patterns, and deep etching of the silicon wafer. High temperature polypropylene solution can then be spun-coated on the silicon wafer decorated with an array of silicon pillars. Oxygen plasma can be utilized to remove the polypropylene layer on the top of the silicon pillars. Finally sulfur hexafluoride ($SF_6$) plasma can be utilized to etch off the array of silicon pillars. After etching a polypropylene monolith filter can be released from the silicon wafer. A variety of different illustrative embodiments are described below.

Section I

VARIOUS ILLUSTRATIVE EMBODIMENTS

Figure 13:
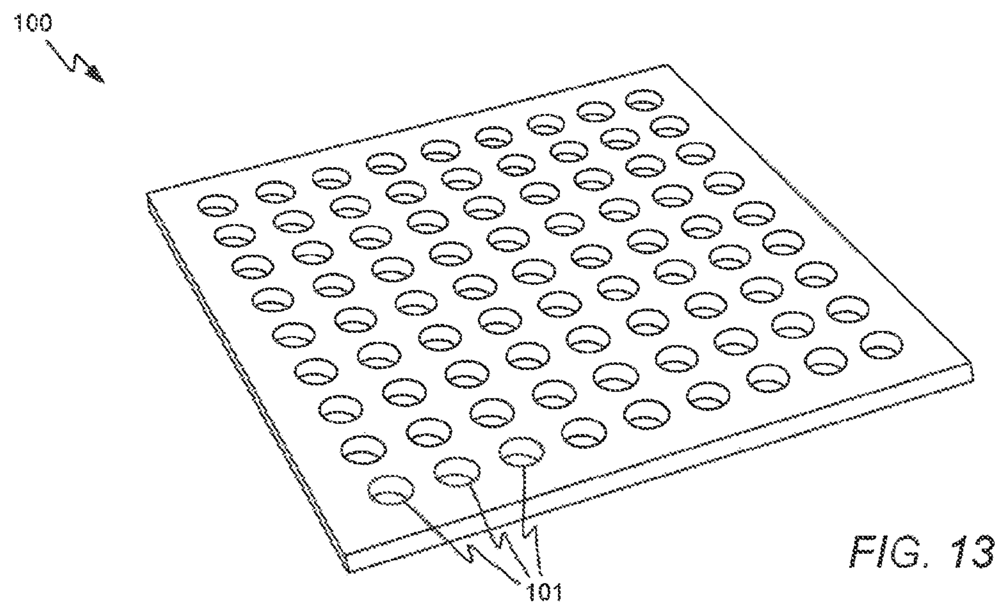
FIG. 13 depicts a perspective view of a polymer monolith filter, according to an illustrative embodiment.

FIG. 13 depicts a microscopically structured monolith filter 100 comprising an array of channels 101, as an example of a structured polymer monolith in accordance with one illustrative embodiment. Various embodiments of structured polymer monoliths may be fabricated according to fabrication methods such as method 200 of FIG. 14, which provides an illustrative example for fabricating a structured polymer monolith. Method 200 includes a number of steps including step 201, of forming a pattern of features on a wafer, thereby forming a patterned wafer; step 203, of forming a polymer layer on the patterned wafer; step 205, of using a first plasma to remove a portion of the polymer layer; step 207, of using a second plasma to etch off at least a portion of the pattern of features, thereby providing a structured polymer monolith. In this illustrative embodiment, method 200 may also include step 209, of applying an electrostatic charge to the structured polymer monolith. These steps are further discussed as follows.

Figure 4A:
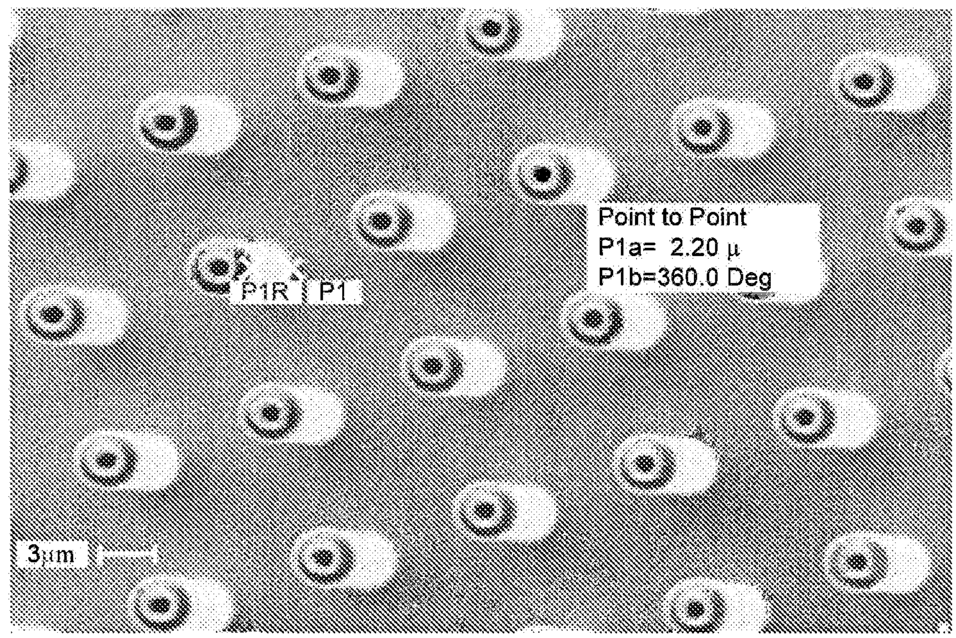
FIG. 4*a* depicts an array of circular pillars on a silicon wafer, in accordance with an illustrative embodiment.
Figure 4B:
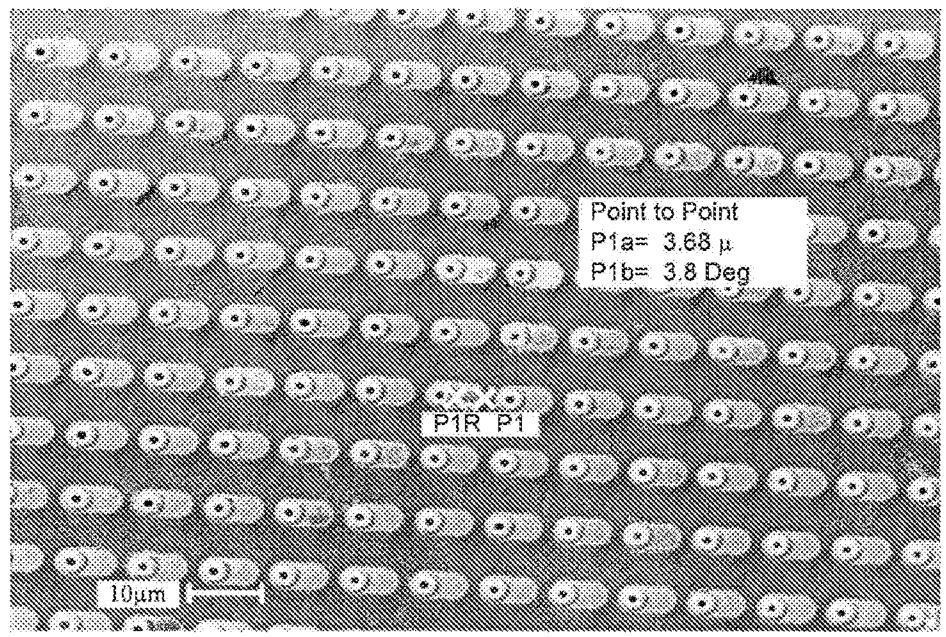
FIG. 4*b* depicts an array of circular pillars on a silicon wafer, in accordance with an illustrative embodiment.

Step 201, of forming a pattern of features on a wafer, thereby forming a patterned wafer, may encompass using any of a variety of photolithography, spin-coating, and other techniques, and may include forming any of a wide variety of features in any of a wide variety of sizes on the wafer. As one illustrative example, the pattern of features may include pillars, which may be arranged in an array, such as in a grid pattern in which the pillars are formed in positions that may be described as vertices of a rectangular grid, as depicted in FIGS. 4*a* and 4*b*. In other embodiments, pillars may be formed on a wafer in any of a wide variety of other patterns such as hexagonal or irregular. In still other embodiments, pillars and/or other features may be formed in a range of different sizes on the same wafer. In still other embodiments, a wide variety of other features may be formed on the wafer besides pillars.

Figure 1:
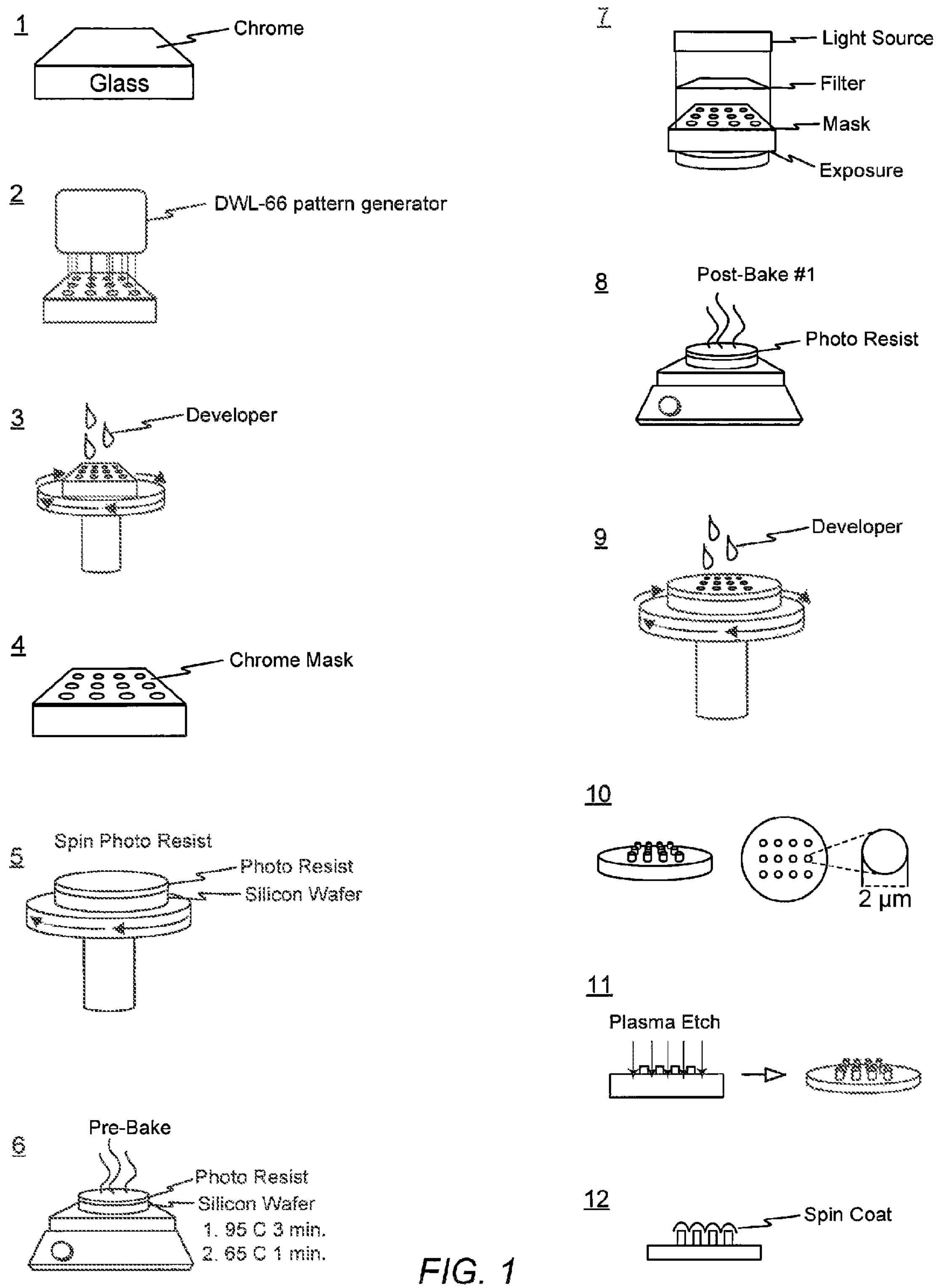
FIG. 1 depicts a series of fabrication steps for a method for fabricating structured polymer monoliths, in accordance with an illustrative embodiment.

In an illustrative embodiment, forming the pattern of features on the wafer may include some or all of the steps illustrated in FIG. 1, which depicts some steps involved in an illustrative method for fabricating a polypropylene monolith filter comprising an array of microscopic channels, as an example of a method for fabricating a structured polymer monolith. The fabrication steps illustrated in FIG. 1, including those referenced here, are further described in Section II below. These steps may include preparing a patterned photomask configured with an array of dots, as in steps 1 through 4 of FIG. 1; applying a photoresist to the wafer, as in step 5 of FIG. 1; shining electromagnetic radiation, such as ultraviolet light, through the patterned photomask at the wafer, as in step 7 of FIG. 1; applying a photoresist developer to the wafer, as in step 9 of FIG. 1; and etching the wafer, as in step 11 of FIG. 1.

In this example, etching the wafer forms a patterned wafer having an array of pillars, corresponding to the array of dots in the patterned photomask. The pillars may illustratively have a diameter of ten microns or less. For example, the inventors have fabricated and/or performed numerical studies involving pillars in the range of between two microns and five microns, for example. Other embodiments may include pillars having a larger or smaller diameter than this range. Certain equipment used for some embodiments that have been fabricated by the inventors has a limiting lithographic writing resolution in the range of 0.8 microns to 0.5 microns, though other equipment may be used with a finer resolution.

The patterned wafer may then serve as a mold for formation of features on a polymer layer. For example, by forming pillars on the wafer, the wafer may serve as a mold for creating a polymer layer with channels molded in the positions of the pillars.

Figure 14:
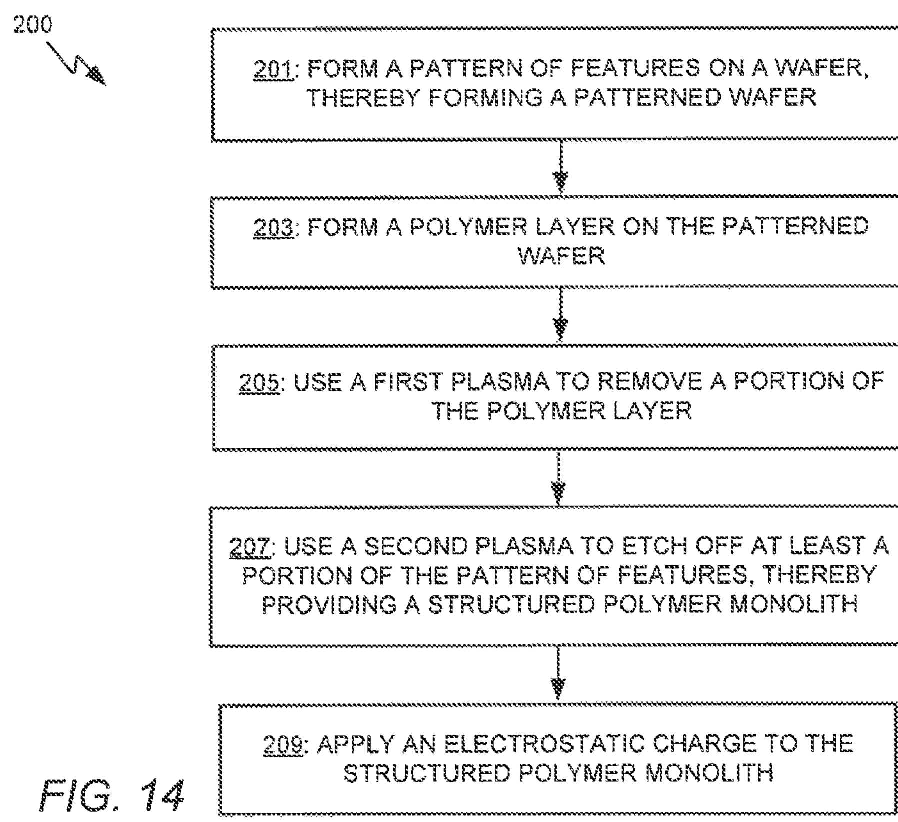
FIG. 14 depicts a flowchart for a method for fabrication of polypropylene monolith filters comprising an array of micron-sized channels, in accordance with an illustrative embodiment.

Accordingly, method 200 of FIG. 14 also includes step 203, of forming a polymer layer on the patterned wafer. Forming the polymer layer on the patterned wafer may illustratively include spin-coating a polymer solution onto the patterned wafer. This is illustratively depicted in step 12 of FIG. 1. This polymer solution may be a polypropylene solution, for example. Various other methods of applying a polymer layer on the patterned wafer may be used in other embodiments.

The polymer layer is subjected to additional steps which ultimately form it into a structured polymer monolith. Thus, a polypropylene solution may be applied to form a structured polymer monolith is composed of polypropylene. Polypropylene offers several advantages: it is mechanically strong, biologically inert, and chemically stable in acids and organic solvents. In an illustrative embodiment, polypropylene can be charged by a corona charging process and it shows good charge retention abilities. Other thermoplastic polyolefines or other forms of polymer may be used for forming the polymer layer, and thereby the structured polymer monolith, in other embodiments.

In step 205, the first plasma may illustratively be an oxygen plasma, which may be useful for removing polymer such as polypropylene while leaving the silicon of the wafer intact. The oxygen plasma may be used to remove at least a portion of the polymer layer from the patterned wafer. This may re-expose at least portions of at least some of the pillars, which once they are re-exposed may be subject to additional silicon processing steps. This re-exposure of the silicon pillars therefore enables subsequent further etching with a silicon etchant, such as in step 207.

In step 207, the second plasma may illustratively be a silicon etchant plasma. This may be a halogen-bearing plasma, and as a particular example may be sulfur hexafluoride plasma. Other plasmas suitable for removal of the wafer feature material may be used in various embodiments. This second plasma may be used to etch off at least a portion of the pattern of features, thereby providing a structured polymer monolith. For example, referring again to the example of the wafer being patterned with silicon pillar features, a sulfur hexafluoride plasma may be used to etch away the pillars. This may thereby create an array of gaps in the polymer layer where the pillars had been etched away. The pillars may be etched away substantially or completely down to their bases, for example. These gaps formed in the polymer layer where the pillars had been thereby constitute a set of channels extending through the polymer layer. In this form, a structured polymer monolith is thereby formed in such a way that it may be advantageously used as a filter, which may illustratively be in the form of a structured polymer monolith filter having an array of channels formed by etching away of the pillars. That is, the channels may be formed where the polymer solution applied to the wafer solidified around the pillars, before the pillars were then removed such as by etching.

In an illustrative embodiment, this may be in the form of a polypropylene monolith filter having an array of channels defined where the pillars had been etched away. These channels may have a diameter substantially defined by the diameter of the pillars that had defined their form, and which may illustratively be in the range of ten microns or less. As illustrative examples, the inventors have fabricated and performed numerical analyses of polypropylene monolith filters having channel diameters in the general range of two to five microns. As a particular example, one polypropylene monolith filter was made having a channel diameter of about 4.5 microns. Numerical analyses have been done with channel diameters of 5.0 microns and 2.0 microns, as illustrative examples. Other channel diameters below two microns or more than five microns may also be used in various embodiments.

The polypropylene monolith filter may illustratively have a thickness of 50 microns or less. For example, two illustrative examples of polypropylene monolith filters prepared by the inventors have had a measured thickness found to be 13.8 and 19.3 microns, respectively. One illustrative way of controlling for the thickness of a structured polymer monolith is to vary the concentration of the polymer solution used to make the layer. For example, the two polypropylene monolith filters with thicknesses of 13.8 and 19.3 microns were created from polypropylene films spun-coated from 16.7 weight percent and 23.1 weight percent solutions, respectively. In other embodiments, structured polymer monoliths may have a variety of other thicknesses greater or less than this range, and may have structures extending entirely through the thickness of the monolith or extending only part way through. For applications such as a filter, a polymer monolith may have those structures in the form of an array of channels that extend all the way through the thickness of the monolith.

After removing the silicon features, the polymer monolith may then be removed or released from the wafer. In this illustrative embodiment, method 200 may also include step 209, of applying an electrostatic charge to the structured polymer monolith. For example, this may be done using a corona charging process to apply an electrostatic charge to a polypropylene monolith filter, in an illustrative embodiment. In an illustrative embodiment, this may result in a polymer monolith filter, that has a front surface and a back surface with an array of channels extending entirely through from the front surface through to the back surface. The channels may have a diameter of less than or equal to ten microns, and may be arranged in a regular pattern in the polymer monolith filter.

The polymer monolith filter may be mainly composed of polypropylene. That is, in one example, it may be composed of relatively pure polypropylene, using a typical supply of polypropylene as known to those in the relevant field in industry and academia, and to which additional isolation or purification methods may be applied. In another example, any of various additives or other compositions may be part of the polymer layer, while polypropylene remains the majority component. Various other embodiments may use a range of other polymers, in addition to or instead of polypropylene.

In an illustrative embodiment of the monolith filter, the regular pattern the channels are positioned in may include a grid pattern. At least a portion of the channels may have a diameter of between three and seven microns, for example about five microns, in one example. At least a portion of the channels have a diameter of between one and three microns, for example about two microns, in another example. In another embodiment, channels of various widths may be combined in a single filter. The filter may have a thickness in a range of between five and 50 microns between the front surface and the back surface, for example.

The monolith filter may also have an electrostatic charge applied to it. This electrostatic charge may be held by any or all of the front surface of the monolith filter, the back surface of the monolith filter, and the interior surfaces of the channels extending through the monolith filter. This electrostatic charge may provide further advantage in selectively filtering particles of different sizes, and may contribute, in combination with channel diameter, to screening out charged particles below a minimum threshold size. An electrostatically charge on a monolith filter may also induce polarization on neutral particles and contribute to filtering of neutral particles. Charges on the filter surface can polarize the uncharged particles in the flow field creating electrostatic attractive forces between the particles and the surface of the monolith. The filtering contributions of electrostatic charge on a polypropylene monolith filter are further discussed below in Section III.

Additional details of a set of illustrative examples in accordance with the present disclosure are set forth below in Section II, "Fabrication of Polypropylene Monolith Filters Using Photolithography And Spin-Coating Techniques", the entire description of which addresses particular illustrative examples, selected from among a broader range of different embodiments encompassed by the present disclosure.

In Section II, reference is made to the following commercial products believed to be available at the time of this writing from the following commercial entities: S1818 photoresist from Shipley Co. LLC, a division of Dow Chemical Co. of Midland, Mich.; standard prime grade 4 inch silicon wafers from Wafer World Inc. of West Palm Beach, Fla.; HamaTech wafer processor from HamaTech APE of Sternenfels, Germany, a division of SUSS MicroTec AG of Garching, Germany; Heidelberg DWL 66 laser pattern generator, from Heidelberg Instruments GmbH of Heidelberg, Germany; ABM contact aligner from ABM Inc. of Scotts Valley, Calif.; Unaxis SLR 770 etcher, from OC Oerlikon of Pffiffikon, Switzerland; model WS-400E-6NPP-LITE spin coater from Laurell Technologies Corp. of North Wales, Pa.; syndiotactic polypropylene with an average molecular weight (MW) of about 127,000, from Sigma Aldrich Corp. of St. Louis, Mo.; P10 stylus-based surface profiler profilometer, from KLA-Tencor Corp. of Milpitas, Calif.; Oxford Plasma Lab 81 system from Oxford Instruments PLC of Abingdon, Oxfordshire, England; and a scanning electron microscope (SM) from Corning Inc. of Corning, N.Y.

In Section II, reference is made to FIGS. 1 through 12, and these figures may be referred to where reference to them is made.

Section II

Detailed Illustrative Example of Fabrication of Polypropylene Monolith Filters Using Photolithography and Spin-Coating Techniques There is set forth herein a method for fabrication of polypropylene (PP) monolith filters comprising an array of micron-sized channels. The filters can be produced via photolithography and spin-coating techniques. First, photolithography can be employed to make an array of micron-sized pillars on a silicon wafer followed by spin-coating of polypropylene solutions onto the patterned wafer. Oxygen plasma can be utilized to remove the polypropylene layer on the top of the silicon pillars. Finally sulfur hexafluoride ($SF_6$) plasma can be utilized to etch off the array of silicon pillars, hence releasing the polypropylene monolith filter from the silicon wafer.

An advantage of the newly proposed method over existing procedures such as nuclear track-etch membranes is its capability to precisely determine the distribution pattern and shape structure of the channels in the porous polymer film. In track etching membranes the channels can be randomly distributed; there can be channel overlaps if the number density of the channels is high. The method set forth herein can make an array of channels in the polymer film by using pre-specified CAD patterns without concern regarding channel overlaps. Also, the method set forth herein has no limitation in terms of shape of channels that can be produced. By comparison a shape of channels in track etching membranes can be limited to cylindrical and conical-like. In addition, the method set forth herein can be extended to make porous membranes with different polymer materials that are difficult or impossible to etch, including polypropylene. By comparison, track-etch membranes are currently limited polyethylene terephthalate (PET) and polyethylene terephthalate (PC).

The polypropylene monolith filters fabricated using the method set forth herein can be utilized for the filtration of nanoparticles, size selection, and capturing of biological moieties such as proteins, bacterias, and viruses. Polypropylene has the added benefit of holding an electric charge which can attract and hold charged molecules smaller than the pores.

There is set forth herein a method of making filters with regularly spaced nanoscale pores. The method can comprise forming a mold, spin-coating, and then melting a polymer onto the mold, then etching away the mold. The method can be extended to any structure architecture to make channels and reservoirs, and also to any etchable substrate and any material with a lower liquid transition temperature than the substrate mold. There is also set forth herein a filter comprising regular arrays of nanoscale pores spaced on the nano or microscale, and particularly, in one embodiment, a filter comprising polypropylene.

1. INTRODUCTION

Filtration processes have been widely utilized in industry to eliminate contaminants from gas or liquid streams. Traditional filters are mainly comprised of fibrous media where aerosols flow in the exterior space of fibers. A new type of filter, monolith filters, is comprised of a polymeric thin film with array of channels of submicron diameter. When aerosols flow through a monolith filter, the particles can be captured either on the outer surface of polymer film or on the inner surface of the channels. Improved filtration efficiencies can be achieved by electro-statically charging the monolith filters. Charges on the filter surface can polarize the uncharged particles in the flow field creating electrostatic attractive forces between the particles and the surface of the monolith.

Porous polymeric structures have been fabricated using different techniques such as track etching [1], replication techniques [2-5], laser micromachining [6], and polymerization process [7], etc. Track-etching has been utilized to make polymer membranes with randomly distributed channels. Track-etching was first established on nuclear reactors to produce a wide range of porous membranes [1]. The track etching method of membrane production is primarily based on the use of heavy ion accelerators for channel piercing [8-11]. The track formation and etching processes have been extensively investigated for polycarbonate (PC) and polyethylene terephthalate (PET) but the development of track-etch membranes on other polymers is still limited.

Micro-imprinting and soft lithography are methods derived from replication techniques [12]. The underlying principle of these techniques is the replication of a micro-fabricated mold representing the inverse geometry of the desired polymer structure. Currently the techniques involving replication of a microfabricated mold are mainly utilized to produce polycaprolactone (PCL) porous membranes. It is noted that PCL has a melting temperature of 60° C., which is significantly lower than melting temperature of polyolefines such as polypropylene (160° C.). Laser micromachining techniques [6] make it possible to pattern polymeric materials at the micro-scale using a single-step process. However, irregularities in the shape of the machined channels can be induced due to the spherical aberration and non-circularity of the original laser beam. Laser machining is also time consuming technique Yan et al. developed a nanoporous polymer thin film using a light-induced polymerization process [7]. According to the process described by Yan et al., a non-reactive solvent was first separated from the photopolymer and then removed from via evaporation achieving channel sizes in the range of 20 and 40 nm. Zhang et al. employed a replication technique taking advantage of the elastic instability in a poly-dimethylsiloxane (PDMS) membrane to manufacture submicron features such as a periodic array of circular pores [13]. However the channels produce by this method did not run through the thickness of the film.

There is set forth herein a monolith filter comprising of polypropylene. Polypropylene offers several advantages: it is mechanically strong, biologically inert, and chemically stable in acids and organic solvents. Importantly, polypropylene can be charged by a corona charging process and it shows good charge retention abilities [14-15].

Despite the above mentioned advances in making different types of polymeric porous membranes, there are no techniques reported on how to make polypropylene monolith filters. Fabricating polypropylene monolith filters with regular array of channels in micron size is a challenging task. Since polypropylene has high crystallinity structures and high melting temperature and it is difficult to completely dissolve polypropylene in a solvent at temperatures lower than its melting point hence preventing the development of smooth polymer films.

There are set forth herein fabricated polypropylene monolith filters fabricated using photolithography and spin-coating techniques. According to a fabrication process, there can be provided an array of circular pillars in silicon wafers. A circular pillar can be formed in a silicon wafer by way of photolithography processes. Photolithography processes can include, in one embodiment spin-coating of a photoresist such as S1818 on silicon wafers, shining UV light through the photomask, and deep etching of the silicon wafer. High temperature polypropylene solutions can be spun over the silicon wafers decorated with an array of pillars. After a layer of polypropylene thin film on the silicon substrate is provided, oxygen plasma can be utilized to remove the uppermost layer of the polymer film to make certain the channels run through the entire thickness of the film. Finally $SF_6$ plasma can be utilized to etch off the array of silicon pillars. Once the pillars are removed the polypropylene monolith filter can be released from the silicon substrate.

2. EXPERIMENTAL

Example 1

2.1 Fabricating Array of Pillars in Silicon Wafer

Standard prime grade 4 inch silicon wafers from Wafer World Inc. were utilized in the photolithography process. Since exposure of silicon wafers to air may introduce agglomeration of dust particles on the wafer surface, silicon wafers were cleaned using the Hamatech wafer processor before the photolithography process. The Hamatech wafer processor is capable of doing a hot piranha (a mixture of $H_2SO_4$ and $H_2O_2$) cleaning procedure on silicon wafers. Photolithography processes were utilized to fabricate an array of silicon pillars in a silicon wafer.

Photolithography process steps in the described example were performed as a sequence in an order to ensure that the remaining photoresist at the end of the process is an optimal image of the photomask. Detailed process steps to make polypropylene monolith filters according to the present Example are listed below (FIGS. 1-1 to 1-12):

1. An original photomask, a piece of square-shaped glass with chrome coating on one side was cleaned.
2. The photomask was written upon using imported CAD patterns and a laser pattern generator, Heidelberg DWL 66.
3. Development of the mask.
4. The patterns were imprinted on the photomask
5. Spin coating of photoresist S1818 on a silicon wafer.
6. Prebaking of the wafer on a hot plate, 95° C. for 3 minutes and 65 for 1 minute.
7. Shining of a UV light through the photomask into the photoresist film using an ABM contact aligner.
8. Postbaking of the wafer on a hot plate, 95° C. for 5 minutes.
9. Development of the pattern using S1818 developer.
10. The array of photoresist was then patterned on the Silicon wafer.
11. Deep etching of Silicon wafer using the Unaxis SLR 770 etcher with SF6 gas.
12. Spin-coating of a polypropylene solution onto the silicon wafer with array of pillars.

FIG. 1. A sequence of pictures showing the processes of making polypropylene monolith filters using photolithography method and spin-coating technique.

Figure 2:
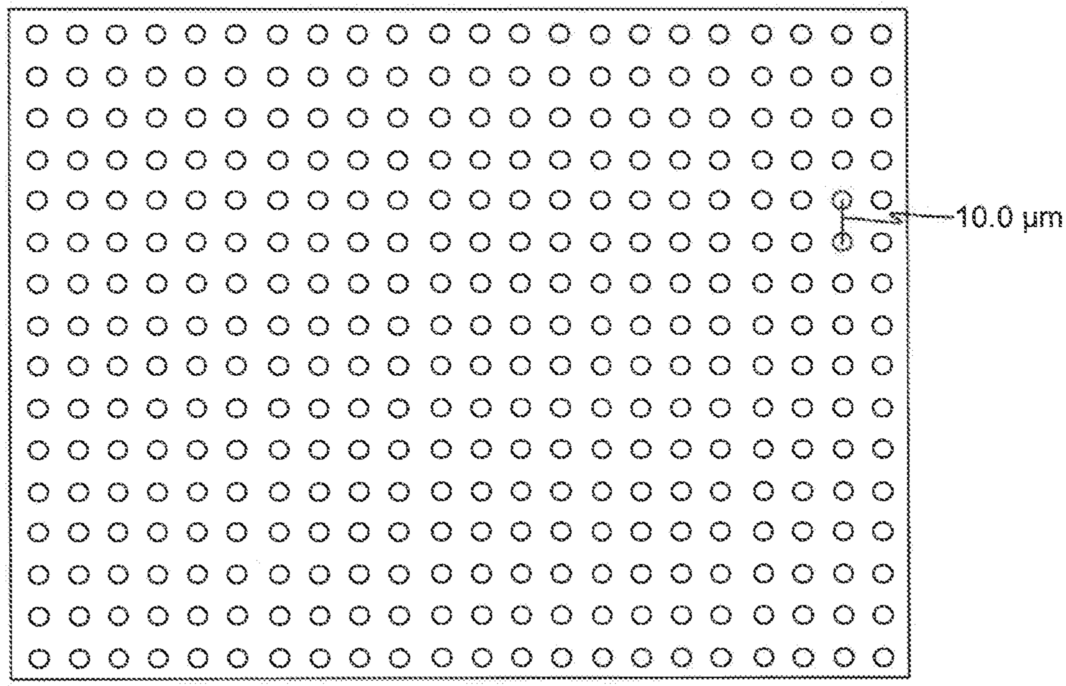
FIG. 2 depicts a representation of an image of part of a photomask, in accordance with an illustrative embodiment.

The first step of a photolithography process in the described Example was to develop prescribed patterns in a photomask. FIGS. 1-1 to 1-4 illustrate the procedures to develop photomasks using the laser pattern generator (Heidelberg DWL 66) utilizing imported CAD patterns. The CAD patterns were generated using the L-Edit software, a layout editor specially designed for photolithography. During the writing process, photomasks were mechanically moved beneath the writing lens in one axis while the 442 nm He—Cd laser beam were scanned in the transverse direction. The resolution of the pattern generating tool and the width of the scan were determined by the final lens. The 10 mm working distance lens utilized produced a spot as small as 2.4 um in diameter. A microscopy image of the generated photomask with array of circular dots is shown in FIG. 2. In the described Example, there were totally 1000 by 1000 circular dots in the photomask and the diameter of these dots is about 4.5 μm.

FIG. 2. Image of part of the photomask, the diameter of circular dots is 4.5 μm.

According to a next step a pattern in the photomask was transferred to a photoresist layer on a silicon wafer by selective exposure to a radiation source such as UV light. A photoresist is a photosensitive material that experiences a change in its physical properties when exposed to a radiation source. In FIGS. 1-5 to 1-10 there is demonstrated the processes of making S1818 (Shipley Inc.) photoresist patterns on a silicon wafer, which include spin-coating photoresist S1818 on silicon wafer, shining the UV light through the photomask into the photoresist film using a contact aligner and developing the pattern using S1818 developer made by Shipley Inc.

A spin speed of 3500 rpm was chosen for the spin-coating process, which produced uniform S1818 films with a thickness of approximately 2.0 μm. The contact aligner utilized was the ABM Mask Aligner; it is a versatile instrument with interchangeable light sources which allow Near-UV (405-365 nm) as well as Mid- and Deep-UV (254-220 nm) exposures in proximity or contact modes. The exposure parameters such as the wavelength of the UV light, dose and time duration of the radiation were optimized in order to achieve accurate pattern transferring from the photomask to the photoresist layer. At the edges of a pattern light is scattered and diffracted, therefore if an image is overexposed, the dose received by photoresist at the edge may become significant; for a positive photoresist such as S1818 resulting in a decrease in feature size and a loss of sharpness. If a photoresist is severely underexposed, the pattern may not be transferred at all. In our experiment, Near-UV light source was utilized with a wavelength of 405 nm, which has a printing resolution of 0.8 μm. The exposure time was optimized at 4.7 s.

Figure 3:
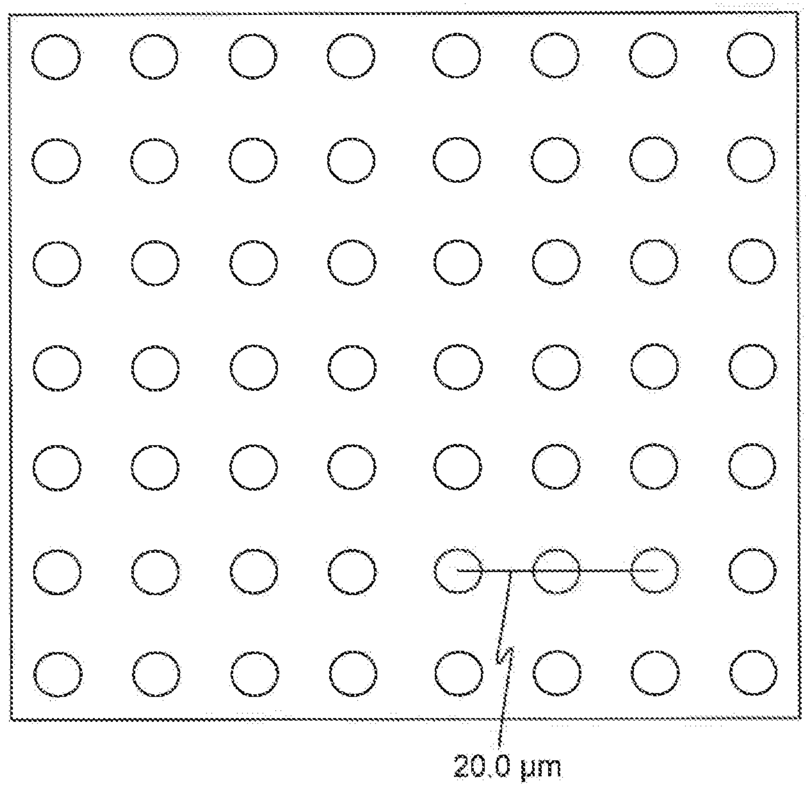
FIG. 3. depicts an array of photoresist dots on a silicon wafer, in accordance with an illustrative embodiment.

FIG. 3. Array of S1818 photoresist circular dots on silicon wafer, the height of the S1818 photoresist dots is 2.0 μm.

After the photoresist pattern on the silicon wafers (FIG. 3) was obtained, a Bosch Unaxis 770 etcher was utilized to develop an array of pillars in the silicon wafer. The Bosch Unaxis 770 etcher is a single chamber, inductively coupled plasma/reactive ion etcher, which is mainly utilized for deep feature etching in silicon substrates. The plasma gas utilized for the silicon etching was $SF_6$. During the etching process the height of the circular pillars was proportionally related to the etching time (about 0.5 micron per minutes), and the maximum feature width to depth aspect ratio can be achieved with this tool is up to 20:1.

FIG. 4*a*. Array of circular pillars in silicon wafer, height of pillars: 11.5 μm.

FIG. 4*b*. Array of circular pillars in silicon wafer, height of pillars: 19.3 μm.

FIGS. 4*a* and 4*b* show exemplary SEM images of an array of pillars in silicon wafers fabricated by the described deep silicon etching process. The SEM sample stage was tilted in order to obtain a better 3D view. The silicon pillars are uniformly located in regular lattices with a grid distance of 10 μm. The side walls of the circular pillars are smooth, and the edge profiles between the bottoms of pillars and the substrate are also sharp and well defined. The tilt angle of the stage with respect to the horizontal reference plane for both images is 11.0 degrees. The heights of these pillars computed based on the point to point distances and the tilt angle are 11.5 μm and 19.3 μm for pillars shown in FIG. 4*a* and FIG. 4*b*, respectively.

Figure 5:
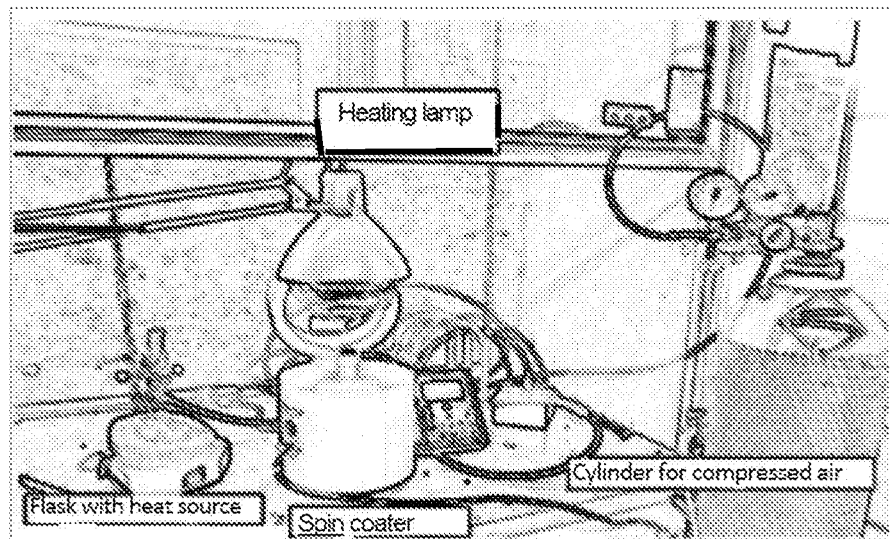
FIG. 5 depicts a spin-coating system which includes a spin-coater, a compressed air cylinder, a flask with heat source and a heating lamp, in accordance with an illustrative embodiment.

2.2 Spin-Coating of Polypropylene Solution on Silicon Wafer with Array of Pillars A system for use in spin-coating in the described example is illustrated in FIG. 5. The exemplary system comprises a spin-coater, a compressed air cylinder, a flask with heat source and a heating lamp. The spin coater utilized in the described example was a model WS-400E-6NPP-LITE from Laurell Technologies Corp. A proprietary motor seal of the spin-coater protects the motor and control electronics from chemical contamination. A 60 psi of Clean Dry Air is usually required to pressurize the motor seal, which is provided by the compressed air cylinder shown in this figure. After a substrate is loaded onto the chuck of the spin-coater, a vacuum hold down is engaged from the side mounted control panel. A preprogrammed spin process is then started with the lid closed.

FIG. 5: Spin-coating system utilized in the present study, which includes a spin-coater, a compressed air cylinder, a flask with heat source and a heating lamp.

The polypropylene utilized is the described example was syndiotactic polypropylene with an average molecular weight (MW) of about 127,000 (Sigma Aldrich). The melting point of syndiotactic polypropylene is about 160° C. according to Lock et al. [16]. Decalin was chosen as a solvent for polypropylene as decalin has a boiling point of 189° C. Complete dissolution of polypropylene pellets can be achieved in about two to three hours when the solution is heated at 189° C. After the polypropylene was completely dissolved into the solvent the solution was spin-coated onto the silicon wafer decorated with an array of pillars.

Polypropylene solutions were prepared with two different weight concentrations, 16.7 wt % and 23.1 wt %. During the spin-coating process, solution was observed to flow radially due to the centrifugal force, and the solution's excess was ejected off the edge of the silicon substrate. The polymer film's uniformity depends on many factors, such as spin rate, substrate temperature, polymer molecular weight and structure, and solution concentration [16]. It was observed that a decrease of the spin rate can cause an increase of the film thickness. However, decreasing the spin rate will also increase the surface roughness of the polymer film. It was found that a spin-speed of 2000 rpm for 1 min was able to produce smooth polypropylene films.

Figure 6:
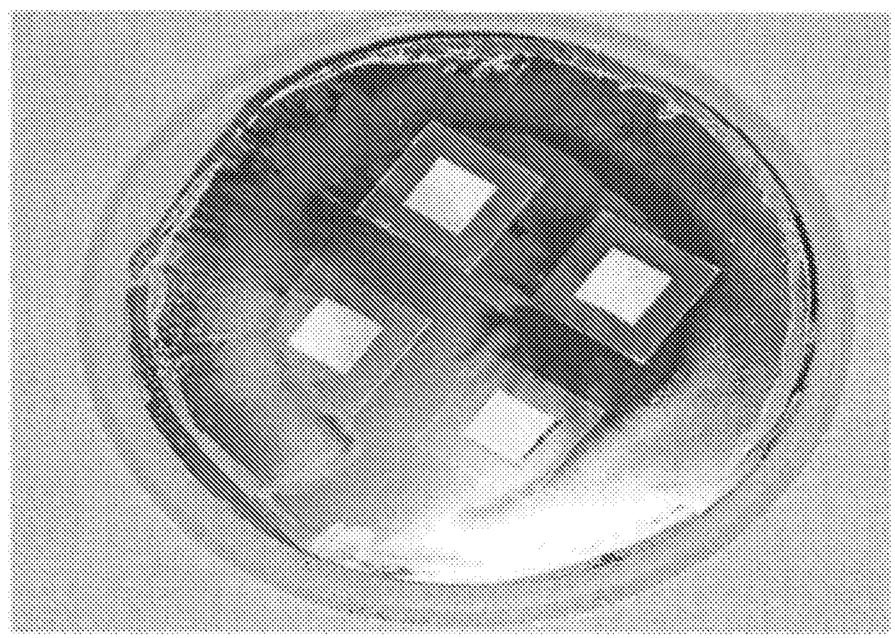
FIG. 6 depicts a polypropylene film on a silicon wafer with four symmetric monolith filter patterns, in accordance with an illustrative embodiment.

FIG. 6 shows a spun-coated polypropylene film on a silicon wafer containing four symmetric monolith filter patterns. While the majority of the polypropylene film on the silicon wafer is quite smooth, a small section on the left side shows some roughness, which is mainly due to the quick solidification of polypropylene solution during the spin-coating process. The quick, non-uniform solidification mainly occurs close to the edge of the silicon wafer where the temperature is lower during the spin-coating process. The quick, non-uniform solidification was found not to affect the final quality of the monolith filters, which are located close to the center of the substrate. The sections with a bright color correspond to the array of silicon pillars covered with polypropylene film. The optical microscopy image (FIG. 7) shows the array of silicon pillars running through the transparent polypropylene films.

FIG. 6. Polypropylene film on silicon wafer with four symmetric monolith filter patterns.

Figure 7:
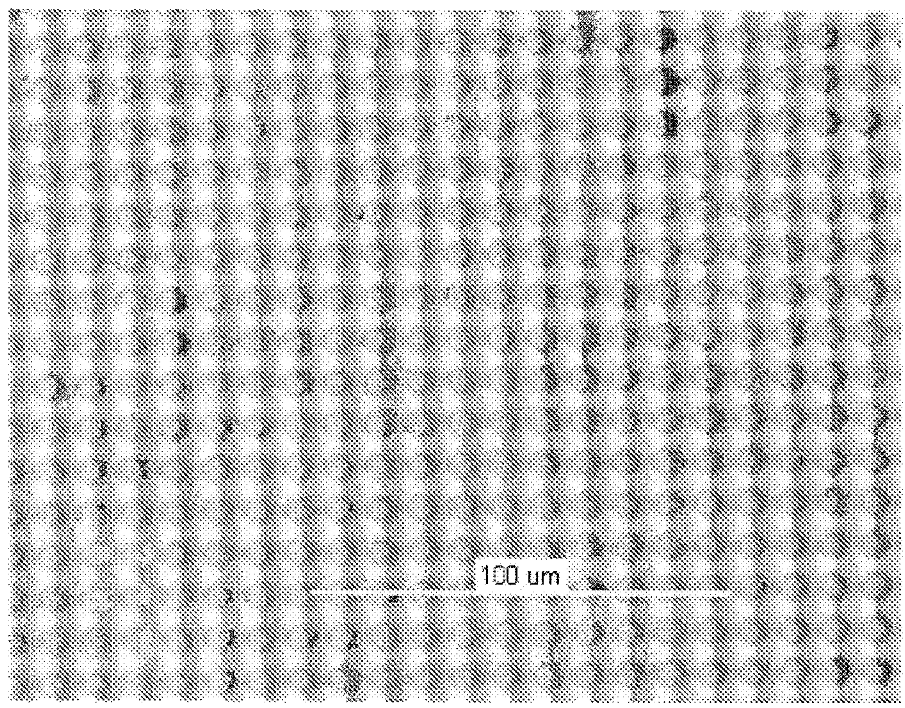
FIG. 7 depicts a representation of a microscopy image of polypropylene film on an array of silicon pillars, in accordance with an illustrative embodiment.

FIG. 7. Microscopy image of polypropylene film on array of silicon pillars.

A stylus-based surface profiler, the P10 profilometer (Tencor), was utilized to analyze the film thicknesses. A bare silicon surface was utilized as the reference plane during the measurement. The measured thickness was found to be 13.8 and 19.3 μm for polypropylene films spun-coated from the 16.7 wt % and 23.1 wt % solutions, respectively. The thickness of the polypropylene films depends on the concentration of the polymer solution and the spin speed during the spin-coating process. Higher concentrations and/or lower spin speeds lead to thicker polymer films.

2.3 Etching of the Uppermost Layer of Polypropylene Film and the Array of Silicon Pillars After the spin-coating process, Oxygen plasma (Oxford 81) was utilized to remove the polypropylene layer on the top of silicon pillars. The removal of this excess layer is necessary to ensure the channels ran through the entire thickness of the film. The Oxford Plasma Lab 81 is a turbo-pumped reactive ion etching (RIE) system mainly dedicated to processes involving Fluorine based gas chemistries such as $CF_4$ and $SF_6$ as well as oxygen chemistries. It was found that a 25 minute of $O_2$ plasma treating process was enough to etch off the polypropylene layer above the silicon pillars. $SF_6$ plasma was then utilized to etch off the array of silicon pillars.

3. RESULTS AND DISCUSSION 3.1 Polypropylene Monolith Filter

Figure 8:
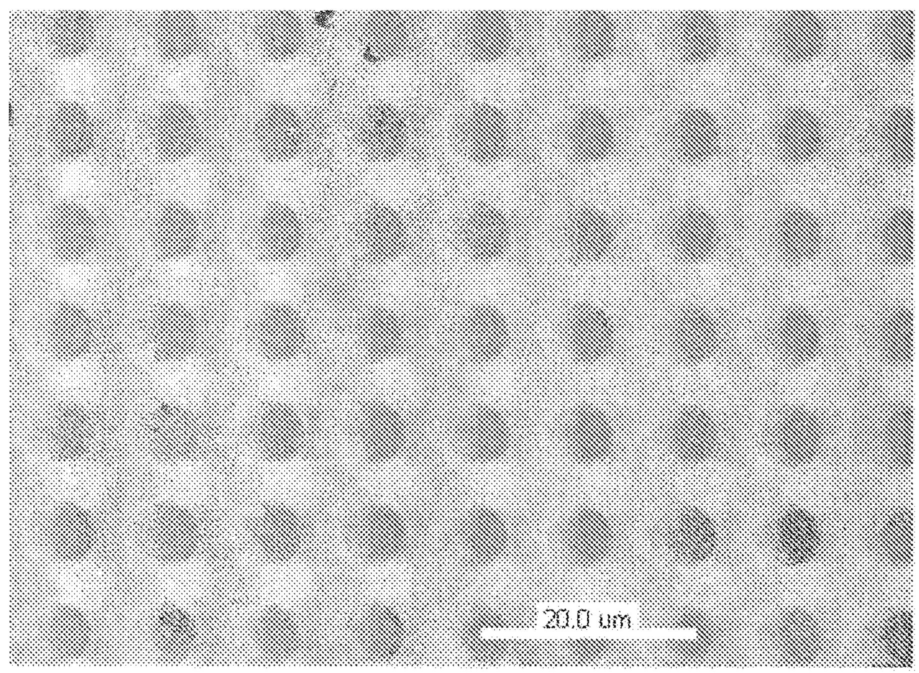
FIG. 8 depicts a representation of a microscopy image of a portion of a polypropylene monolith filter, in accordance with an illustrative embodiment.

A microscopy image of a polypropylene monolith filter is shown in FIG. 8. The diameter of the channels was about 4.5 micron, and a total number of one-million channels (1000 by 1000) are uniformly distributed in 1 by 1 centimeter area in the polypropylene film. Two PP monolith filters were fabricated, one with a thickness of 9.0 micron, the other 14.7 micron.

Figures 9, 10A:
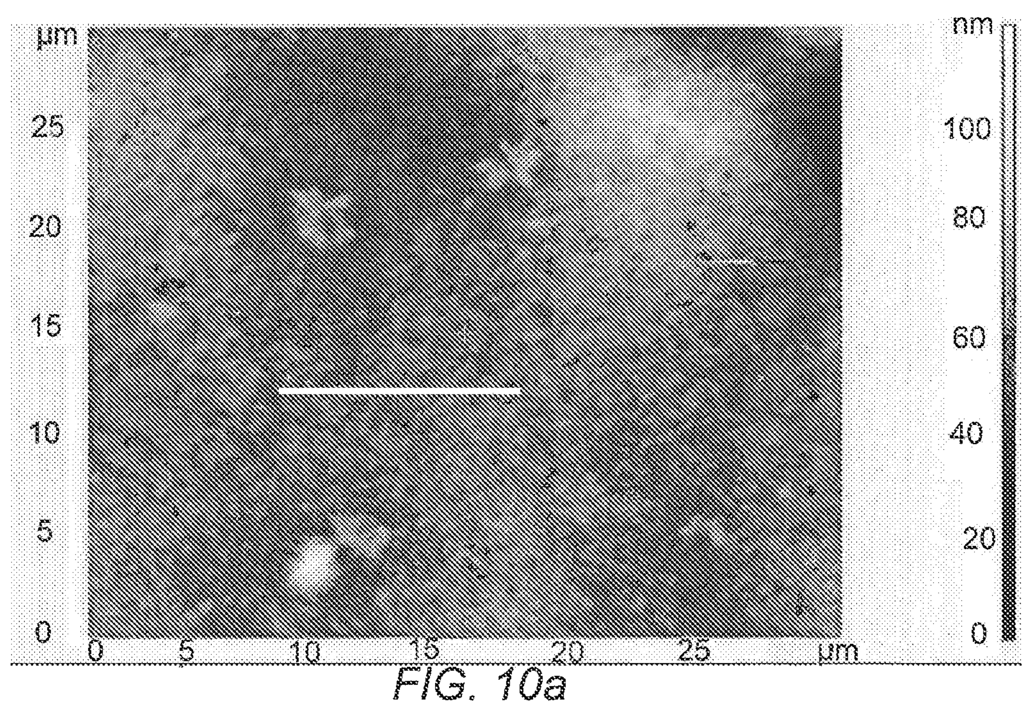
FIG. 9 depicts representation of a an image of a polypropylene monolith filter, in accordance with an illustrative embodiment.
FIG. 10*a* depicts a representation of an AFM topography of a polypropylene film prepared by spin-coating technique before oxygen plasma etching, in accordance with an illustrative embodiment.

FIG. 8: Microscopy image of a portion of a polypropylene monolith filter. The diameter of the channel is 4.5 μm and the total number of channels in the filter is 1000 by 1000. FIG. 9 shows a picture of a polypropylene monolith filter after it has been released from the silicon wafer. The overall quality of the filter in terms of smoothness is fine except that a small portion of the film was slightly stretched. This pattern distortion is believed to be due to remaining internal stress built up at the interface between the polypropylene film and the silicon wafer substrate. It was found that in the final product the diameter of the channels is about 4.5 micron instead of the 5.0 micron that was originally specified in the CAD file. It is noted that photolithography consists of a sequences of processes including pattern generation on photomask, preparation of the wafer surface, deposition of the requisite resist thickness, exposure of the silicon wafer with the optimal time and dosage, develops the resist under the optimal conditions etc. Properties of lithography are feature and topography dependent. The modest and acceptable difference between the specified values and final feature size may be the result of the pattern writing process since the writing resolution is about 0.5 micron.

FIG. 9: Image of a polypropylene monolith filter. The total PP film is a 2 by 2 cm square and there are 1000 by 1000 channels in the 1 by 1 cm square area in the center of the film.

3.2 Film Surface Characterization

A complete polymer dissolving can encourage development of a smooth film. Since polypropylene has high crystallinity, to ensure a complete polymer dissolving, the solution should be heated at or above the polymer melting temperature. In the present example, decalin was utilized as the solvent for polypropylene. Decalin has a boiling point of 189° C., which is higher than the melting temperature of polypropylene (160° C.). A complete dissolving of polypropylene pellets was obtained in about two to three hours at the boiling temperature of decalin. If the silicon wafer is at room temperature during the spin-coating process, the polypropylene solution will be solidified very quickly, making it hard to form smooth polymer film on the silicon substrate. The silicon wafer was therefore heated to 200° C. using a hot plate. The spin-coater chuck was also heated to at least 60° C. using a heating lamp in order to minimize heating gradients.

Figure 10B:
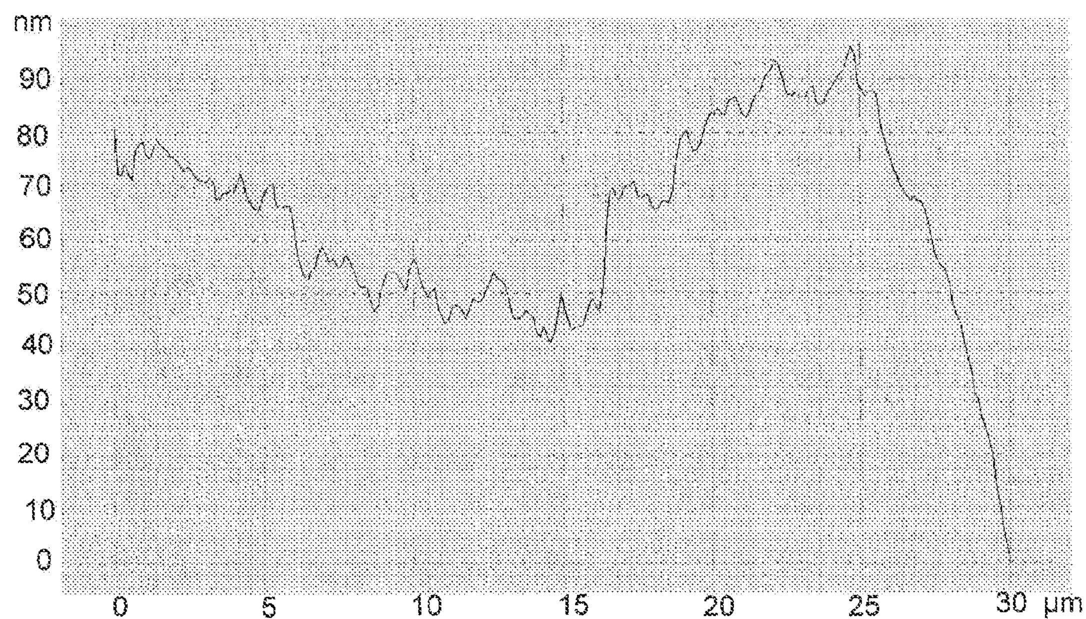
FIG. 10*b* depicts a height profile of a scan line in polypropylene film before oxygen plasma treating, in accordance with an illustrative embodiment.

The topography of the polypropylene film was studied using Atomic Force Microscopy (AFM). FIGS. 10*a* and 10*b* illustrates the variation of surface roughness of the spun-coated polypropylene film which was found to be less than 110 nm. After the oxygen plasma surface etching of the film, the variation of surface roughness of increased to 370 nm (FIGS. 11*a* and 11*b*).

FIG. 10*a*. AFM topography of polypropylene film prepared by spin-coating technique before the oxygen plasma etching, and the scan area is 30×30 μm.

FIG. 10*b*. Height profile of a scan line in polypropylene film before the oxygen plasma treating.

Figure 11A:
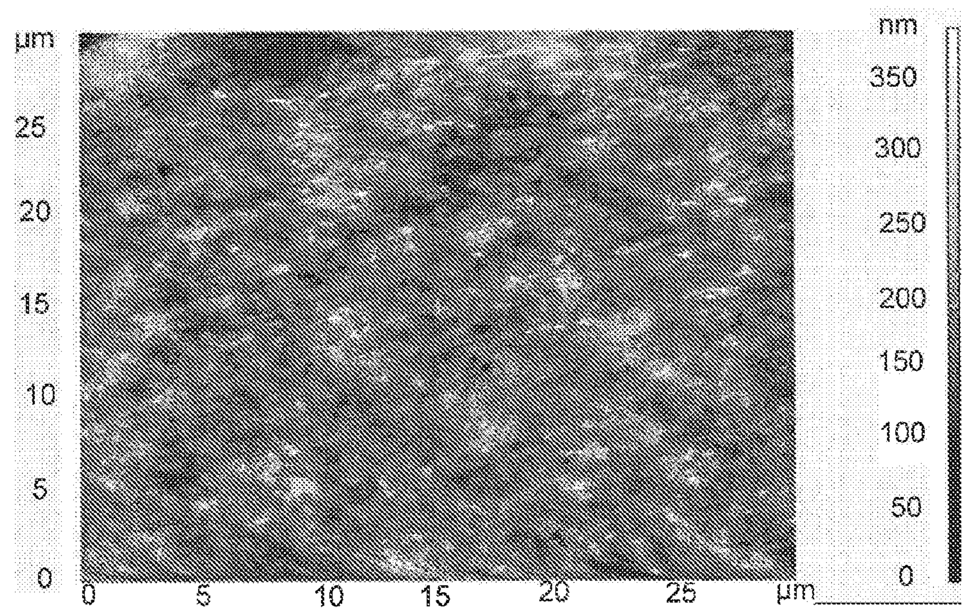
FIG. 11*a* depicts a representation of an AFM topography of polypropylene film prepared by spin-coating technique after oxygen plasma etching, in accordance with an illustrative embodiment
Figure 11B:
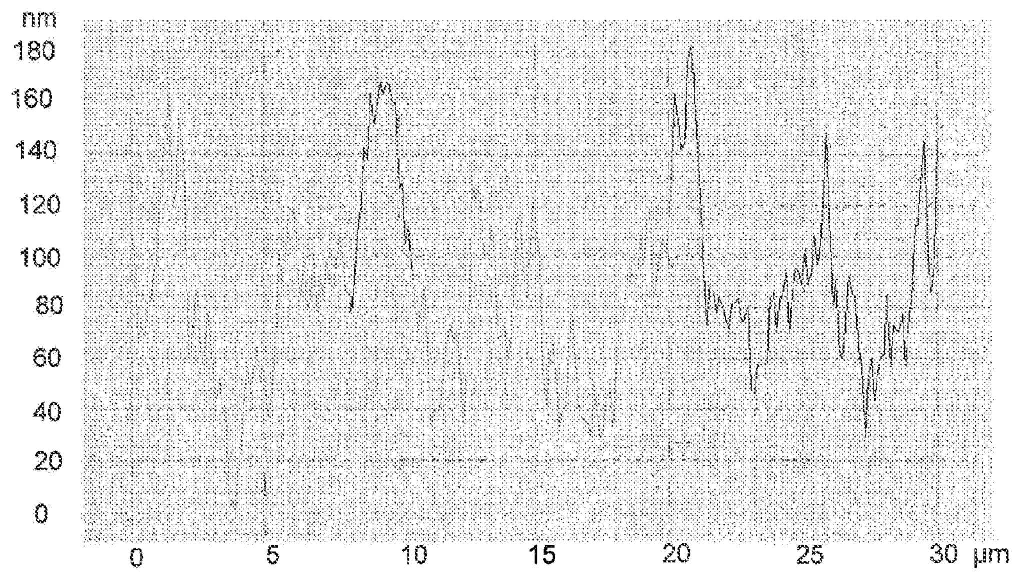
FIG. 11*b* depicts a height profile of a scan line in polypropylene film before the oxygen plasma treating.

FIG. 11*a*. AFM topography of polypropylene film prepared by spin-coating technique after the oxygen plasma etching, the scan area is 30×30 μm. FIG. 11*b*. Height profile of a scan line in polypropylene film before the oxygen plasma treating.

3.3 Comparison with Track Etching Porous Membranes

An advantage of the described method over track etching technique is that it can precisely define the geometrical shape and distribution pattern of the channels. The shape of the channels made by track etching method is limited to cylindrical and conical like. The present method has no limitations for making different shapes of channels since the shapes are determined by CAD patterns imported into the photolithography process.

Figure 12:
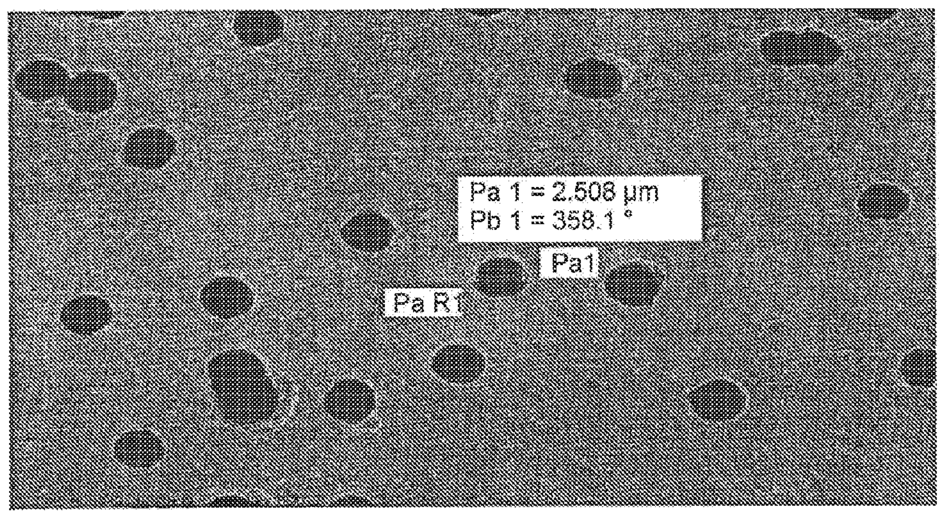
FIG. 12 depicts a representation of a scanning electron microscope image of a track etching membranes, in accordance with an illustrative embodiment.

The channels can be randomly distributed in the track etched membranes, forcing channel overlaps even when the number density of the channels in the membrane is relatively low (FIG. 12). The low area ratio of the channel to the total surface of the track-etching membrane indicates a low hydraulic permeability. Hydraulic permeability is an important factor that determines the performance level of filters. The present method can make an array of channels in the membrane via prescribed patterns without exhibiting channel overlaps. That is to say, the area ratio of the channel to the total surface of the monolith filter is much higher hence improving the hydraulic permeability and performance level of the monolith filters.

FIG. 12: SEM image of a track etching membranes (Corning Inc.)

In addition, the described method can be utilized to make porous membranes based on different materials. Difficulties in the etching procedure and poor reproducibility of film properties impede the manufacture of track etching membranes from polymeric materials other than PET and PC [17].

4. CONCLUSIONS

A method to make polypropylene monolith filters using photolithography and spin-coating techniques is set forth herein. The method in one embodiment can include spin-coating high temperature polypropylene solutions on silicon wafers decorated with arrays of silicon pillars and utilizing additional plasma etching steps to ensure the channels in the polypropylene film go through an entire thickness of the film. The size, shape, and distribution pattern of the channels in the polypropylene film can be well defined as a result of application of the method. Parameters utilized in the photolithography and spin-coating processes can be optimized for yielding smooth monolith filters.

The described method is aimed to improve the efficiency filtration of nanoparticles. Enhanced filtration efficiencies can be further achieved by electro-statically charging the monolith filters. The charge distribution on the surface of the monolith filters can be closely related to the size, shape, and distribution pattern of the channels. The present method can be utilized to fabricate porous polymer membranes with channels of different shapes and spatial distribution patterns and hence different electrostatic charge properties, which can be further investigated towards improving the filtration efficiency of nanoparticles in aerosol flows. The monolith filters developed in the example set forth herein can also be utilized for virus detection and controlling transport of solute into cells, bacteria, etc.

Section II

REFERENCES

[1] R. L. Fleischer, P. B. Price, and R. M. Walker, University of California Press, Berkeley (1975).

[2] Y. Y. Li, F. Cunin, J. R. Link, T. Cao, R. E. Belts, S. H. Reiver. Science 299 (2003) 2045.

[3] S. Y. Chou, P. R. Krauss, P. J. Renstrom, Appl. Phys. Lett. 67 (1995) 3114-3116.

[4] F. Gottschalch, T. Hoffmann, C. M. S. Torres, H. Schulzb, H.-C. Scheer, Solid-State Electron. 43 (1999) 1079-1083.

[5] Y. N. Xia, G. M. Whitesides, Annu Rev. Mater. Sci. 28 (1998) 153-184.

[6] V. Kancharla, S. C. Chen, Biomed. Microdev. 4 (2002) 105-109.

[7] W. Van, V. K. S. Hsiao, Y. B. Zheng, Y. M. Shariff, T. Gao, T. J. Huang, Thitt Solid Films 517 (2009) 1794-1798

[8] D. Gopalani, S. Kuner, A. S. Jodha, S. Rita, P. K. Khatri, and R. Gopal, J. Membrane Sci., 178 (2000) 93-98.

[9] E. Ferain, and R. Legras, Radiation Measurement, 34 (2001) 585-588.

[10] Yamazaki, I. M., Paterson, R. and Geraldo, L. P. (1996). J. Membrane Sci., 118 (1996) 239-245.

[11] P. Apel, Radiation Measurements 34 (2001) 559-566.

[12] Y. Lu, S. C. Chen, Advanced Drug Delivery Reviews 56 (2004) 1621-1633

[13] Y. Zhang, E. A. Matsumoto, A. Peter, P. C. Lin, R. D. Kamien, and S. Yang, Nano Letters 8 (2008) 1192-1196.

[14] J. Kim, W. Jasper, J. Hinestroza, Journal of Engineered Fibers and Fabrics, 1 (2006) 30-46.

[15] J. Kim, W. Jasper, J. Hinestroza, Journal of Microscopy, 20 (2007) 1-8.

[16] E. Lock, S. Walton and R. Fernsler, Naval Research Laboratory report, (2008) NRL/MR/6750-08-9092.

[17] T. Chittrakarn, T. Bhongsuwan, P. Wanichapichart, P. Nuanuin, S. Chongkum, A. Khonduangkaew and S. Bordeepong. Songklanakarin J. Sci. Technol., 24 (2002) 863-870

Section III

Modeling of Collection Efficiency of Nanoparticles for Electrostatically Charged Monolith Filters with Array of Cylindrical Channels The inventor has performed numerical studies for the flow field and filtration efficiency of nanoparticles for structured polymer monolith filters of various embodiments. The interior surfaces of the channels are assumed to retain a uniform electrostatic charge, aiming to enhance the adherence force and increase the filtration efficiency. The present work can be considered as a generalization of Wu et al. (2010)'s work, which considers only the interior channel flow field and the effect of electric field of a single channel.

The velocity fields in a three dimensional flow domain were solved by using the Lattice Boltzmann method along with a slip boundary condition. The electric field in the flow domain was obtained by a linear addition of the electric fields of neighbor channels. Trajectories of solid particles with diameters ranging from 20 to 300 nm were then computed by solving the particle motion equation in order to obtain the filtration efficiency. Numerical results show that the electrostatic force is a crucial factor that affects the collection efficiency of the monolith filter. The computed collection efficiency of charged nanoparticles is encouraging, especially under slow flow conditions. The study also discovered that the collections of charged nanoparticles on the front and back surfaces of the filters are as important as that on the inner channel surface, which in a way improves the collection efficiency of the monolith filter. This feature can not be explored by considering only the inner channel flow (Wu et al. 2010). These results indicate that monolith filter is a promising type of filter for capturing electrostatically charged nanoparticles. This study also helps design and improves the performance of such a monolith filter.

INTRODUCTION

Removal of particulate contaminants is of great importance in personal protective equipments, microelectronics and pharmaceutical industries. And as nanotechnology advances at a remarkable rate, concern is also rising over the health risks related to the inhalation and exposure of nanoparticles (Oberdorster, 2005). There are several studies on how well the standard air filtration techniques work with nanoparticles. For examples, Kim et al. (2007) measured silver nanoparticles (3 nm-20 nm) penetration through several filter media and Yun et al. (2007) prepared ultrafine fibers through electrospinning process and evaluated the performance of electrospun filters by measuring the penetration of NaCl nanoparticles. Traditional filters are mostly made of fibers with circular cross-sections, however, recently research has shown a growing interest in nonconventional filters (Fardi and Liu, 1992a, b, Ushe 1993, Ming and Liu, 1998, Zhu et al., 2000, Chen et al., 2002, Cao et al. 2004, Zhu and Hinestroza, 2009, Wang et al. 2009, and Wu et al. 2010) for potential improvement in porosity, particle loading capacity and collection efficiency.

In the present study, a numerical simulation is performed in order to help design a new class of filter, monolith filter and hence achieve high filtration collection efficiency for nanoparticles. FIG. 13 illustrates such a monolith filter, where an aerosol flow can be filtered through the channels in the filter. The prevailing porous polymeric structures have been fabricated via track etching method (Fleischer et al. 1975). However the pores are randomly distributed in the track-etching membranes, and there could be pore overlaps even when the number density of the pores in the membrane is relatively low. As a consequence the size of the pores cannot be controlled precisely, which is not a preferable property for an effective filter. On the contrary, in the monolith filter shown in FIG. 13, the size and distribution of the channels can be precisely controlled.

In Wu et al. (2010)'s work, a single channel model is mathematically built using a Monte Carlo simulation of particle trajectories. And the collection efficiency for sub-micron neutral and charged particles are also numerically investigated. In their study, particles are individually released uniformly at the entrance plane, which may not be the case in a real aerosol flow. It is reasonable to assume a homogenous particle distribution in the far field when the flow field is uniform. However, the flow field is inhomogeneous close to the channel entrance. Also if both the particles and the filters are charged, particles will endure the electrostatic force before they flow into the entrance of the channels, and the closer the particle to the entrance, the stronger the force. Even if particles are uniformly distributed in the far field, they won't keep the uniformity as soon as they flow close to the entrance. In addition, a monolith filter consists of array of channels, and the electric field around a single channel is also affected by the electric fields of neighbor channels. Therefore a linear addition of the electric field of neighbor channels is needed to obtain realistic collection efficiency for an electrostatically charged monolith filter. Also, particles can either be captured in the inner surface of channels or on the front and back surfaces of the filter. The collection efficiency results won't be complete if only the inner channel surface is considered for particle collections.

The present study was focused on the effects of the electrostatic charge, the magnitude of channel diameter, particle size and flow velocity on the collection efficiency of monolith filters. Three dimensional numerical simulations were first conducted for the flow field of the periodic representative cell by using a slip boundary condition. The dominant factors in submicron-scale particle collections are the surface interaction including electrostatic force and Brownian diffusion. Brownian diffusion is modeled as a white noise process using a randomly fluctuating force. The drag force comes from Stokes's law under low Reynolds numbers. It is noted that Kim and Zydney (2004 and 2006) investigated two dimensional particle trajectories for both cross flow and normal flow filtration systems by including the effects of Brownian motion and the inter particle interactions. The trajectories of spherical particles with diameters varied from 20 to 300 nm were then computed by solving the particle motion equation in order to obtain the collection efficiencies of the monolith filter. In the present simulations a one way coupling is assumed, which indicates that the influence of the particle on the flow is neglected. This is a reasonable assumption for fluid flow with extremely low Reynolds number and small particles (Wu, 2010).

Computation of the Flow Field

As shown in FIG. 13, the monolith filter consists of a regular array of circular channels. The flow field is therefore assumed to develop a periodic pattern along the x and y directions. Consequently computation of the flow field can be confined to a representative flow cell shown in FIG. 15. Parameters $X_0$, $Y_0$ and $Z_0$ are reference lengths in the x, y and z direction, and they are equal to 1 μm. The shape of the representative cell is a rectangular prism with a height of 18 μm. The cross-section of the prism is a square with a side-length of 4 μm. The filter has a thickness of 10 μm, and a circular channel is situated in the center of filter with a diameter of 2 μm.

The Navier-Stokes equations governing the flow field can be written as $$\nabla \cdot u = 0, \tag{1}$$

$$\partial_t u + (u \cdot \nabla) u = -\frac{1}{\rho} \nabla p + \nu \nabla^2 u. \tag{2}$$

where ρ is the fluid density, u is the flow velocity vector and v is the kinematic viscosity. The Lattice Boltzmann model (Chen et al., 1991, Qian et al., 1992 and Chen and Doolen, 1998) was used to solve the governing equations. Lattice Boltzmann model has been proven to be an efficient alternative solver for the Navier-Stokes equations in a wide range of applications (Succi, 2001).

In one numerical model, a Lattice Boltzmann model may consist of two processes, the first being the propagation of fluid particles to neighboring lattice grids and the second being collisions between particles when they reach the same sites. The general form of the Lattice Boltzmann equation is $$f_i(x + c_i\delta_t, t + \delta_t) - f_i(x, t) = -\frac{1}{\tau}[f_i(x, t) - f_i^{eq}(x, t)], \quad i = 0, 1, \ldots q-1, \tag{2-3}$$

where q is the number of directions of the particle velocities at each node and the particle distribution functions $f_i$(x, t) describes the mass density distribution of fluid particles with velocity $c_i$, at a lattice node x and time t.

In the above evolution equations, τ is the dimensionless relaxation time, $v=c_s^2\delta_t(\tau-0.5)$ the kinetic viscosity, x the grid point coordinate, and $\delta_t$ the time step. Function $f_i^{eq}$ is the local Maxwell type distribution function expressed as a Taylor expansion to the second-order in fluid velocity. The equilibrium distribution for the D3Q19 model is given as $$f_i^{eq} = \rho\omega_i\left[1 + \frac{c_i \cdot u}{c_s^2} + \frac{(c_i \cdot u)^2}{2c_s^4} - \frac{u \cdot u}{2c_s^2}\right], \quad \omega_0 = \frac{1}{3}, \omega_i = \frac{1}{18}, i = 1-6, \omega_i = \frac{1}{36}, i = 7-18. \tag{2-4}$$

where $c_s$ is the sound speed of the lattice fluid, which is defined as $c_s^2=1/3$. Once the discrete populations $f_i$, are known, the fluid density ρ and velocity u can be evaluated by the following equations, $$\rho = \sum_{i=0}^{q-1} f_i, \quad (2\text{-}5)$$

$$\rho u = \sum_{i=0}^{q-1} c_i f_i. \quad (2\text{-}6)$$

Through a multi-scale Chapman-Enskog analysis of the LBGK model (Chen and Doolen, 1998, Chen et al., 1991), it can be shown that the macroscopic variables ρ and u defined in equations (2-5) and (2-6) obey the Navier-Stokes equation for a weakly compressible fluid:

$$\partial_t \rho + \nabla \cdot (\rho u) = 0, \quad (2\text{-}7)$$

$$\partial_t u + (u \cdot \nabla) u = -\frac{1}{\rho} \nabla p + \nu \nabla^2 u. \quad (2\text{-}8)$$

And the pressure is given by the equation of state $$p = c_s^2 \rho. \quad (2\text{-}9)$$

Due to the symmetry of the representative cell with respect to the x and y axes, only the flow field of one quarter of the domain (0<x, y<2 μm) was computed. The collection efficiency was computed under a steady flow field and the Buoyancy effects were neglected. A slip boundary condition depicted in the following section was applied at the inner surface of the channel.

Modeling of the Slip Boundary Condition

In computing the flow field in small-scale structures such as flow through the micron-sized channels, the use of the classical Navier-Stokes equations along with the non-slip boundary condition is no longer valid since the mean free path of the gas molecules is non-negligible compared to the characteristic domain size. The degree of the rarefaction effects can be characterized by the Knudsen number, Kn, which is defined as the ratio of the mean free path of the gas molecules to the characteristic length scale of the system. The flow field can be categorized into several regimes based on the magnitude of the Knudsen number (Gad-el-Hak, 1999, Schaaf and Chambré, 1961). For Kn≤0.01, the continuum assumption is generally valid and the flow can be described by the Navier-Stokes equations and the conventional non-slip boundary condition. For Kn>10, the continuum approach breaks down completely and this regime can then be modeled as being a free-molecular flow. In the range of 0.1<Kn≤10, the continuum assumption in the Navier-Stokes equations begins to break down and alternative methods such as higher-order Knudsen number approaches (Burnett, 1935), Monte Carlo method (Bird, 1994) and Boltzmann equations (Sone, 2002) have been used to characterize the flow in this transition regime. In the range of 0.01≤Kn≤0.1 the flow is usually referred to as the slip flow, and it is widely recognized that the Navier-Stokes equations are still valid to simulate the flow field provided the slip velocity boundary condition is implemented.

This study focused on the slip flow regime (Kn≤0.1), and it has been proved that in this regime the LBM along with a diffuse-scattering boundary condition can well reproduce the slip phenomena (Ansumali and Karlin, 2002 and Sofonea and Sekerka, 2005). The slip velocity usually refers to the non-zero tangential component of fluid velocity relative to the wall boundary. According to the kinetic theory of gases (Karniadakis and Beskok, 2002) the non-dimensional slip velocity relates to the local tangential velocity gradient through a series expansion in the Knudsen number. The general second-order slip condition can be written as (Karniadakis and Beskok, 2002):

$$u_s = u_{fw} - u_w = C_1 Kn \frac{\partial u}{\partial \eta}\bigg|_w - C_2 Kn \frac{\partial^2 u}{\partial \eta^2}\bigg|_w \quad (3)$$

where η is the distance from the wall, normalized with respect to the reference length L and $u_{fw}$ is the tangential component of the fluid velocity on the wall, $u_w$ the wall velocity, and it is noted that in the present study the wall velocity is set equal to zero. The value $C_1=1$ is in agreement among most models, including the first-order Maxwell model. It has been shown that the first-order slip boundary conditions are valid for Kn up to 0.1. This study therefore was done with the first order slip boundary condition, i.e. $C_2$ set equal to zero. Note that the mean free path of air is about 65 nm at room temperature, that is to say the current approach is capable of modeling air flow through channels of characteristic diameter down to 650 nm.

In one numerical model, once the fluid velocity $u_{fw}$ at the wall is obtained, the corresponding equations may be determined for the particle distribution functions $f_i(x, t)$. A simple while physically based diffusive rule for the slip boundary condition was first obtained by Ansumali and Karlin (2002). In such diffusive boundary condition when a particle reaches the wall, it gets redistributed in a way consistent with the mass-balance and normal-flux conditions. In addition, if the incoming populations are at equilibrium, the outgoing populations are also at equilibrium. The discrete form of the kinetic boundary condition for the diffuse-scattering kernel can be then written as (Ansumali and Karlin, 2002, Guo et al. 2006, Kim et al. 2008):

$$f_i(x_w, t) = f_i^{eq}(\rho_w, u_{fw}) \frac{\sum_{(c_j - u_w) < 0} |(c_j - u_{fw}) \cdot n| f_j}{\sum_{(c_k - u_w) < 0} |(c_k - u_{fw}) \cdot n| f_k^{eq}}, \quad (2\text{-}10)$$

where $u_{fw}=u_{fw}t$, and the unit vectors t and n denote the tangential and the inward normal directions at the wall boundary, respectively. It is shown that in unidirectional steady slow, Equation (2-10) reduces to (Kim et al., 2008)

$$f_i(x_w, t) = f_i^{eq}(\rho_w, u_{fw})$$

Validation of the Modeling of the Slip Boundary Condition: Poiseuille Flow Under Different Knudsen Numbers The velocity profile for fully developed incompressible laminar flow between two parallel plates (Poiseuille flow) can be obtained by solving momentum equation in the flow direction (Sofonea and Sekerka, 2005), $$\frac{u(y/L)}{U_0} = \frac{-(y/L)^2 + (y/L) + Kn}{1/6 + Kn}, \quad (4)$$

where $U_0$ is the mean velocity in the channel and L is the width of the channel. It is noted that for different Knudsen numbers, the channel width are also varied correspondingly.

Numerical and theoretical results of Poiseuille flow under different Knudsen numbers, 0, 0.01, 0.05 and 0.1, were compared, with favorable results. Non-dimensional velocity profile $u(y/L)/U_0$ was also computed for Poiseuille flow under different Knudsen numbers (Kn=0, 0.01, 0.05 and 0.1) along with the theoretical predictions. The numerical simulations have been done with a constant value of pressure gradient. It is observed that as the slip velocities at the wall boundaries increase with the Knudsen number, and the parabolic velocity profile becomes more and more flattened. In addition, these velocity profiles are very close to the analytical solution (Equation 4), which validates our LBM numerical algorithm and the implementation of the slip boundary condition.

Numerical Simulation of the Collection Efficiency:

Langevin Equation of Particle Motion

The collection of solid particles of a filter in gas flows is mainly achieved through the combined effect of Brownian diffusion, interception, inertia impaction, and gravitational and electrostatics forces. In the present study the gravitational force was neglected. The one-way coupling interaction between the solid particles and the fluid was also employed, i.e. the fluid and solid phases are treated independently. This is a reasonable assumption, since for very dilute particulate suspensions with particle volume concentrations less than 0.1% the effect of particles on the flow field may become negligibly small (Zhu et al., 2000).

The trajectory of individual particles can be obtained by solving the Langevin equation of motion:

$$m_p\frac{du}{dt}=\frac{3\pi\mu d_p}{C_c}(u-u_p)+f_r+f_C+f_P, \tag{5}$$

where $u_p$ is particle velocity, $\mu$ is the viscosity of the gas, $\rho_p$ is the particle density, and $d_p$ is diameter of particles. The first term in the right hand side of Equation (5) represents the drag force applied to a particle, in which the relative slip between the particle and the fluid is also considered by including the Stokes-Cunningham slip factor $C_c$ (Abuzeid et al., 1991). In the present study, particle density is taken to be 2000 kg/m$^3$ and the gas viscosity is $1.79\cdot10^{-5}$ Pa·s.

The force term $f_r$ that corresponds to the Brownian diffusion effect plays an important role for submicron particles. Following the work of Abuzeid et al. (1991), Chen et al. (2002), Cao et al. (2004) and Zhu and Hinestroza (2009), the Brownian diffusion force was modeled via a Gaussian random process, specifically, the component of the Brownian force $f_r^i$(i=x, y) at time t was calculated as $$f_r^i(t)=m_pZ_i\sqrt{\frac{2\pi S_0}{\Delta t}}, \tag{6}$$

where $Z_i$ is a random number with a zero mean and unit variance, and $\Delta t$ is the time step. The term $S_0$ is the spectral intensity of a white noise process (Iwan and Mason, 1980, Orabi and Ahmadi, 1987) given by the following equation $$S_0=\frac{216\mu kT}{\pi^2 d_p^5\rho_p^2 C_c}, \tag{7}$$

where T is the absolute temperature of the gas and k is the Boltzmann constant.

The Coulomb force $f_C$ for charged particle and polarization force $f_P$ for neutral particle have the following expressions (Cao et al. 2004)

$$f_C=N_peE, \tag{8}$$

$$f_P=\frac{\pi}{4}\left(\frac{\varepsilon_P-1}{\varepsilon_p+2}\right)\varepsilon_0 d_p^3\text{grad}|E|^2. \tag{9}$$

where e is the elementary charge, $N_p$ is the charge number, $\in_p$ is the dielectric constant of the particle, $\in_0$ is the space permittivity and vector E denote the electric filed.

A large number of particles are required to compute statistical reliable results for the collection efficiency. The initial positions of the approaching particles on the inlet plane are randomly chosen (Chen et al., 2002 and Cao et al. 2004). For each particle the trajectory was obtained by numerically integrating Equation (5). A particle in the gas stream will be captured once its trajectory approaches the filter surfaces within a distance less than or equal to the particle radius. The collection efficiency of particles for the monolith filter is then defined as the ratio of the number of particles collected by the filter, N, to the total number of particles entering the computational domain, $N_0$, i.e.

$$\eta=\frac{N}{N_0}. \tag{10}$$

Model of the Coulombic and Polarization Forces for Channel Inner Surface

The electrostatic charge is assumed to be uniformly distributed on the inner surface of the channels in the monolith filter. The charged cylindrical surface can be divided into elemental charged circular rings. The theoretical model of electric field of an electrostatically charged ring can be found in Zypman (2005).

A charged circular ring of radius a may be located in the xy plane. A generic source point r' is parameterized by the angle $\alpha$ that it makes with $e_x$:

$$r'=a\cos\alpha e_x+a\sin\alpha e_y. \tag{9}$$

Assume r is a space point, and without losing generality this point may be placed in the xz plane to compute the electric field:

$$r=a\xi\sin\theta e_x+a\xi\cos\theta e_z, \tag{10}$$

where $\xi$ is real number greater than or equal to zero. If quantity Q is the total charge of the ring, the electric field can be written as $$E(r)=\frac{1}{4\pi\varepsilon_0}\frac{Q}{2\pi a}\int_{ring}\frac{r-r'}{|r-r'|^3}dr' \tag{11}$$

where parameter $\in_0$ is the space permittivity. Integral in Equation (11) can be computed numerically through evaluating the elliptical integrals. Following Zypman (2005), the components of the electric field can be written as $$E_x=\frac{1}{4\pi\varepsilon_0}\frac{Q}{\pi a^2}\left\{\frac{\xi\sin\theta}{(1+\xi^2)^{3/2}}f_1(\mu)-\frac{1}{(1+\xi^2)^{3/2}}f_2(\mu)\right\}, \tag{12}$$

$$E_z=\frac{1}{4\pi\varepsilon_0}\frac{Q}{\pi a^2}\left\{\frac{\xi\cos\theta}{(1+\xi^2)^{3/2}}f_1(\mu)\right\}, \tag{13}$$

where

-continued $$\mu = \frac{2\xi}{1+\xi^2}\sin\theta, \quad (14)$$

$$f_1(\mu) = \int_0^{\pi} \frac{d\alpha}{(1-\mu\cos\alpha)^{3/2}}, \quad (15)$$

$$f_2(\mu) = \int_0^{\pi} \frac{\cos\alpha d\alpha}{(1-\mu\cos\alpha)^{3/2}}. \quad (16)$$

Once the electric field due to an electrostatically charged ring is obtained, the electric field of the charged cylindrical surface can also be calculated by numerical integration of the elemental charged rings along the z direction. Following Wu et al. (2010), the surface charge density is assumed to be $1.32\times10^{-5}$ C/m$^2$.

Electric field magnitude distribution in the X-Z plane was modeled, along with the magnitude of the electric field in the X-Z plane and the magnitude of the electric field in the X-Y plane right at the inlet of the channel. The electric field magnitude close to the inlet and outlet of the channel is higher than that in the center. It can be observed that the electric field obtained in this study inside the channel is comparable to FIG. 2 of Wu et al. (2000)'s paper. It is also noted that the black part in the plot is within the filter.

Electric field magnitude distribution in the X-Y plane at the entrance of a channel was modeled, as was the electric field due to the electrostatic charge of a single channel. However, the electric fields of neighbor channels have to be considered to obtain a realistic electric field in the representative cell. A parametric study was performed to determine how many neighbor channels are needed to produce such an electric field with enough accuracy.

Maximum value of the magnitude of the electric field with different size of supporting domains was modeled (Characteristic length D is equal to the diameter of the channel, 2; W is the width of the supporting domain), as was the maximum magnitude of the electric field with different sizes of the square-shaped supporting domains. It was found that as the supporting domain size increases, i.e. when more neighbor channels are considered, the maximum magnitude of the electric field is monotonically increased but is approaching a plateau. Computations showed that the relative difference of the maximum electric fields computed between a non-dimensional supporting domain size of 13 and 15 is only about 1.3%. That is to say, the results are quite close by considering either 169 or 225 neighbor channels. In the present study, the electric field therefore used was computed from 225 channels as the input for the collection efficiency computation. The distribution of electric magnitude in the X-Y plane at the inlet was modeled by considering 225 neighbor channels. It was observed that the maximum electric magnitude occurs at locations close to the charged ring and it is about 1.2 times higher than that computed from one single channel.

Results and Discussion

Flow Field and Particle Trajectory

The flow fields were computed for a three dimensional flow domain. Since the inner diameter of the channel is 2 μm, a slip boundary condition with Kn=0.0325 was a applied in the computation. Two different pressure drops are applied between the inlet and outlet of the flow domain, which result in a relatively slow flow field with an average flow velocity of V=0.1 m/s and a relatively fast flow field with an average inflow velocity of V=1 m/s in the mid-plane ($Z=Z_0/2$, where $Z_0$ is the length of the flow domain) within the channel. The contour plot of the flow velocity field was modeled for the slow flow of V=0.1 m/s at X-Z (Y=0) plane (due to symmetry, only half of the representative domain is shown). Flow velocity was found to be largest close to the center line within the channel. The velocity profile at mid-plane in the channel ($Z=Z_0/2$, Y=0) was modeled under both non-slip and slip boundary conditions. When the Knudsen number becomes finite, the flow velocity at the boundary is no longer zero. Flow velocity close to the centerline decreased in flow with a non-zero Knudsen number. As a consequence, the total flow profile is flattened a little.

Figure 15:
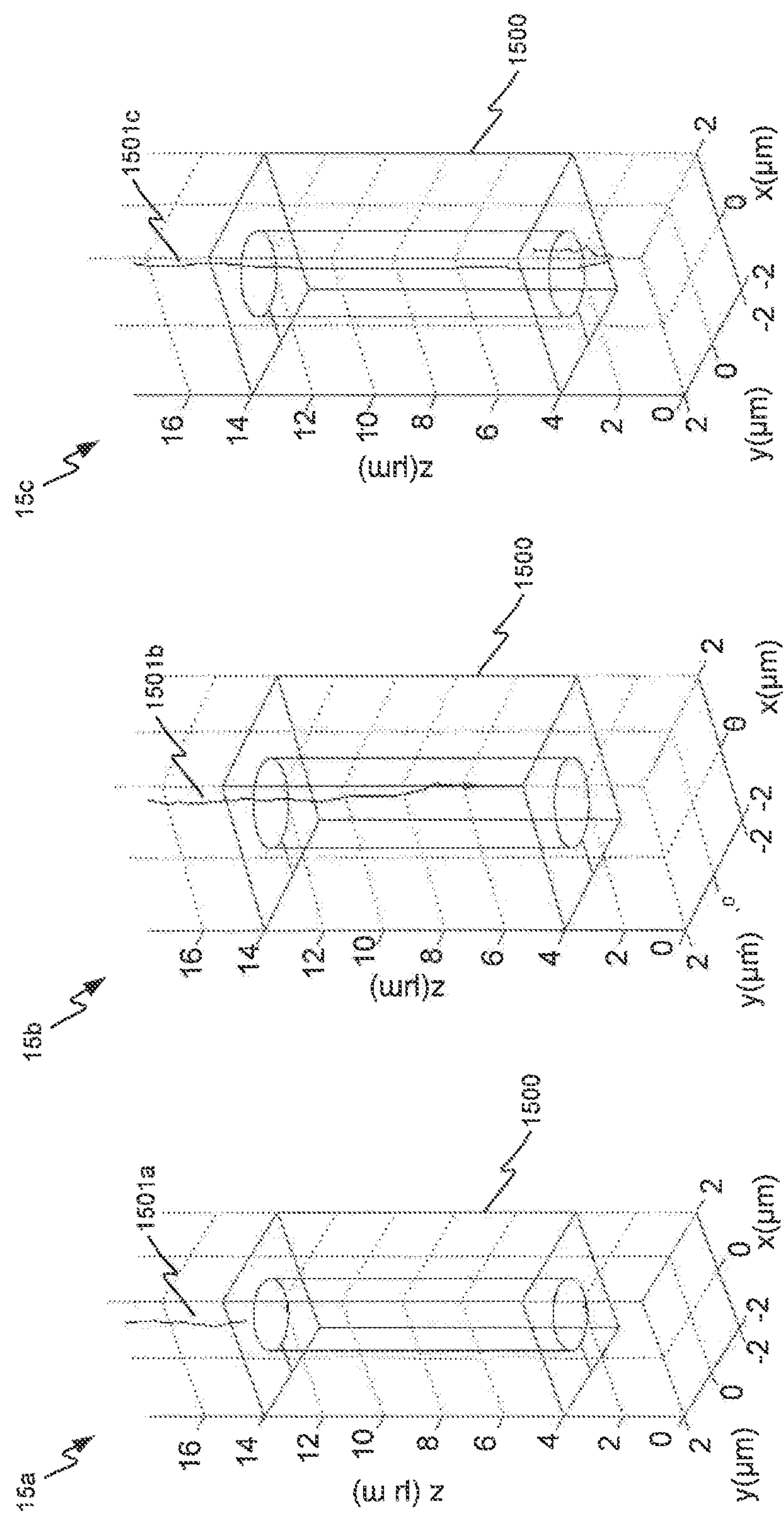
FIG. 15 depicts representative trajectories of particles as determined from numerical modeling, a) captured by a front surface, b) captured by the inner channel surface, and c) captured by the back surface of a polypropylene monolith filter, in accordance with an illustrative embodiment.

FIG. 15 depicts representative trajectories of particles as determined from numerical modeling. Model 15*a* depicts trajectory 1501*a* of a particle captured by the front surface of filter cell 1500. b) captured by the inner channel surface, and c) captured by the back surface. FIG. 15 shows the trajectories of charged particles captured at different locations on the surface of the filter. The paths of the particles deviate from the streamlines and the zigzag paths of the particle trajectory illustrate the Brownian diffusion effect. As shown in these figures, particles can be captured in the front, back or inner channel surfaces. Since particles and the inner surface of the channels are oppositely charged, the particles still undergo the attractive electrostatic force even when they flow out of the channel. As a consequence, some particles will flow backwards and captured by the back surface of the monolith.

Effect of the Electric Field and Flow Field on the Collection Efficiency

Figure 16A:
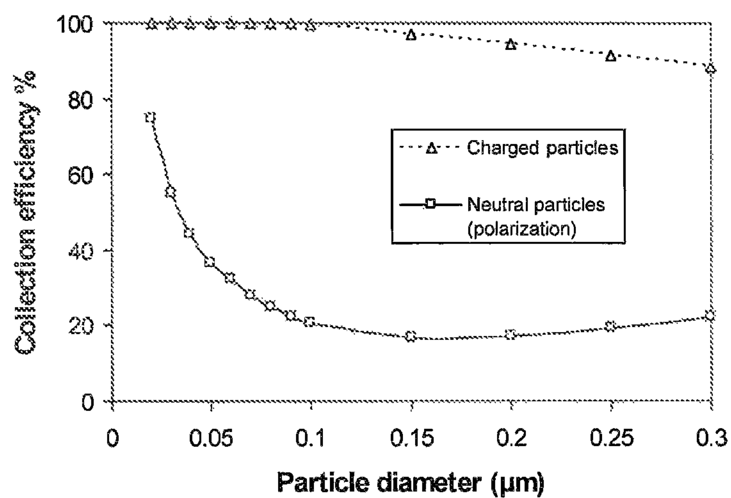
FIG. 16A depicts collection efficiency for charged and neutral particles with different particle sizes at V=0.1 m/s, in accordance with an illustrative embodiment.
Figure 16B:
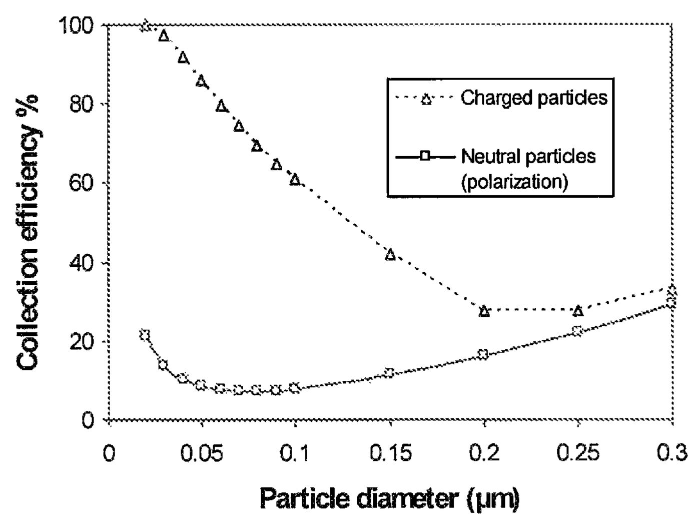
FIG. 16B depicts collection efficiency for charged and neutral particles with different particle sizes at V=1 m/s, in accordance with an illustrative embodiment.

FIG. 16A depicts collection efficiency for charged and neutral particles with different sizes (V=0.1 m/s). FIG. 16B depicts collection efficiency for charged and neutral particles with different sizes (V=1 m/s).

A numerical study for the collection efficiency of nanoparticles with various sizes ranging from 20 nm to 300 nm was performed. In this study, particle deposition effect was not considered, i.e. particles are released one by one into a "clean" filter. Under such conditions, the particulate suspension is very dilute with particle volume concentrations less than 0.1%, therefore the effect of particles in the flow field become negligibly small (Zhu et al., 2000).

FIG. 16A shows the collection efficiencies for charged and neutral particles under the slow flow condition (V=0.1 m/s). The collection efficiencies for charged particles are relatively high. In fact the collection efficiencies for particles with a diameter of less than or equal to 90 nm are 100%. As the particle size increases, the collection efficiency begins to drop, but still keep a high value of about 88%. For neutral particles, the collection efficiency curve takes a "U" shape, i.e. for small particles, the collection efficiency is high (about 75% for 20 nm particles) and as the particle size increases, the collection efficiency decreases until it reaches a minimum value at the particle size of 150 nm. And the collection efficiency begins increase slowly as the particle size keeps increasing. But collection efficiency is much lower for large particles (22% for 300 nm particle) than those for small ones.

FIG. 16B shows the collection efficiencies for charged and neutral particles in a higher flow velocity field (V=1 m/s). Contrary to the slow flow condition, the collection efficiency for charged particles starts to drop at small particle sizes. This trend continues until the collection efficiency curve reaches a minimum value at a particle size of about 200 to 250 nm. Then the collection efficiency increases as the particle size goes to 300 nm. For neutral particles, the collection efficiency curve is still in "U" shape, but this time the collection efficiency for larger particles takes the higher value compared to that for smaller particles.

It is noted that collection of solid particles by a filter in gas flows is mainly achieved through the combined effect of Brownian diffusion, interception, inertia impaction, gravitational sedimentation and electrostatics force. In the present study the gravitational forces were neglected due to the small size of particles considered. The effect due to electrostatic force dominates other collection mechanisms for smaller particles, especially under slow flow condition. As a result, the collection efficiencies for particles with a diameter of less than or equal to 90 nm were found to be 100% (FIG. 16A). For small particles, the Brownian diffusion effect is also prominent, which increase the value of collection efficiency. At larger particle size, the interception and inertia impaction play more important roles; the larger flow velocity also helps enhance the effect of inertia impaction, which explains the higher collection efficiency at larger particle in flow field with higher flow velocity (FIG. 16B).

Figure 17A:
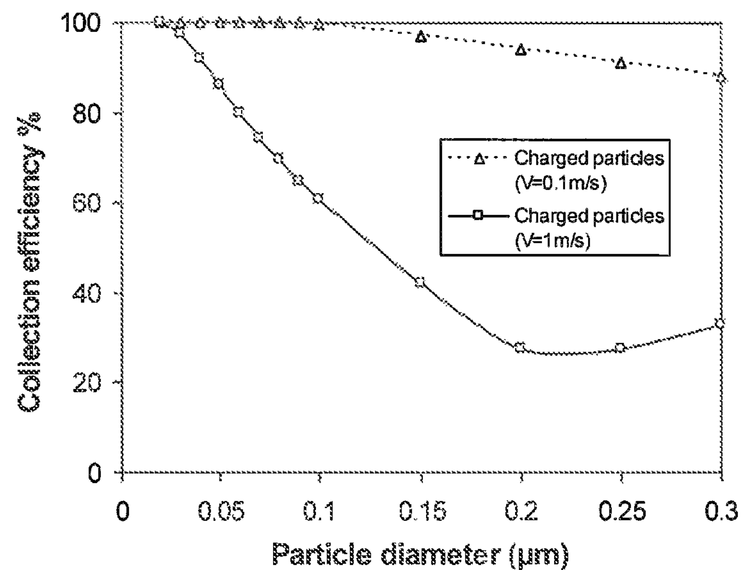
FIG. 17A depicts modeling of collection efficiency for charged particles under different flow velocities, in accordance with an illustrative embodiment.
Figure 17B:
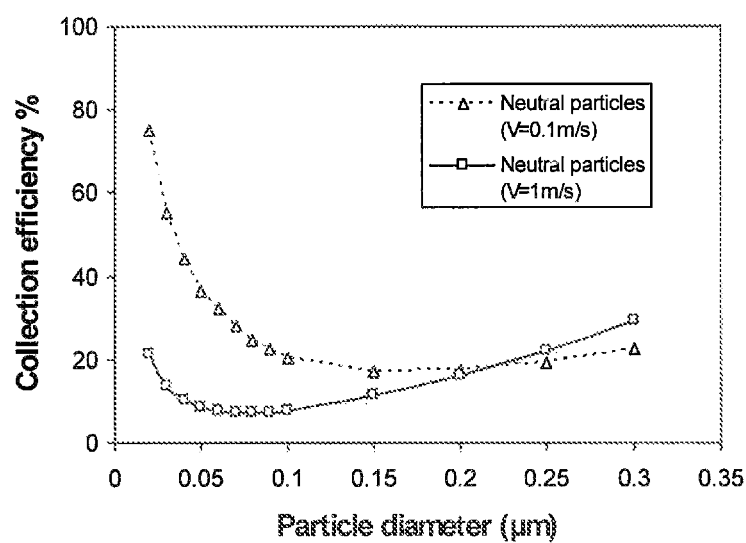
FIG. 17B depicts modeling of collection efficiency for neutral particles under different flow velocities, in accordance with an illustrative embodiment.

FIG. 17A depicts modeling of collection efficiency for charged particles under different flow velocities. FIG. 17B depicts modeling of collection efficiency for neutral particles under different flow velocities.

FIG. 17A shows the comparison of collection efficiencies for charged particles under flow fields with different flow velocities. It can be observed that collection efficiency at slow flow field is much higher than that at a fast flow field. Hydrodynamic (drag) force is applied to the particles, which makes these particles follow the streamlines and flow through the channel; on the other hand, the electrostatic forces attracts the particles in the flow field and makes them deviate the streamlines and impact to the surface of the filter. At slower flow velocity, the electrostatic force effect is more prominent due to the smaller value of drag forces. At higher flow velocity the collection efficiency at 300 nm is great than those at 200 and 250 nm, a result of larger inertia impaction effect.

The comparison of collection efficiencies for neutral particles under different flow fields are is shown in FIG. 17B. Compared to the slow flow condition, the collection efficiency under larger flow velocity is much lower for small particles and a little higher for large particles. The slower the flow velocity the larger the Brownian diffusion effects; which cause higher collection for smaller particles at slow flow condition. The inertia effect becomes larger when the flow velocity increases, which results in a larger collection efficiency for large particles (greater than or equal to 250 nm) at higher flow velocity condition.

Effect of the Channel Size on the Collection Efficiency

To study the effects of the channel size on the collection efficiency, a monolith filter with 5 μm diameter channels was also considered. The geometry of the representative cell is also proportionally increased, with a height of 45 μm and a width/depth of 10 μm. The thickness of the filter becomes 20 μm. The same surface charge density of $1.32\times10^{-5}$ C/m$^2$ is applied to the inner channel surface of the monolith filter. For this larger size channel, the Knudsen number becomes 0.013. Correspondingly a slip boundary condition with Kn=0.013 was applied in the computation. Again, two different pressure drops are applied to the flow domain, which result in a relatively slow flow field with an average inflow velocity of V=0.1 m/s and a relatively fast flow field with an average inflow velocity of V=1 m/s in the mid-plane of the channel.

Figure 18A:
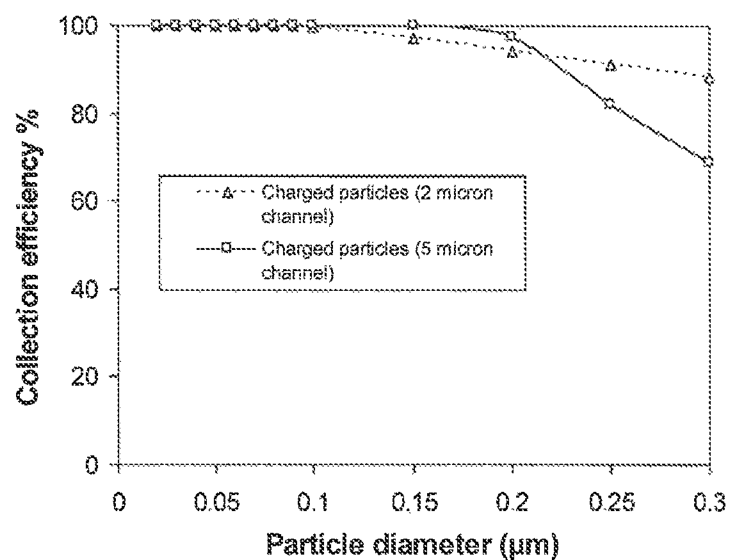
FIG. 18A depicts modeling of collection efficiency for charged particle flow through monolith filters with different channel sizes at V=0.1 m/s, in accordance with an illustrative embodiment.
Figure 18B:
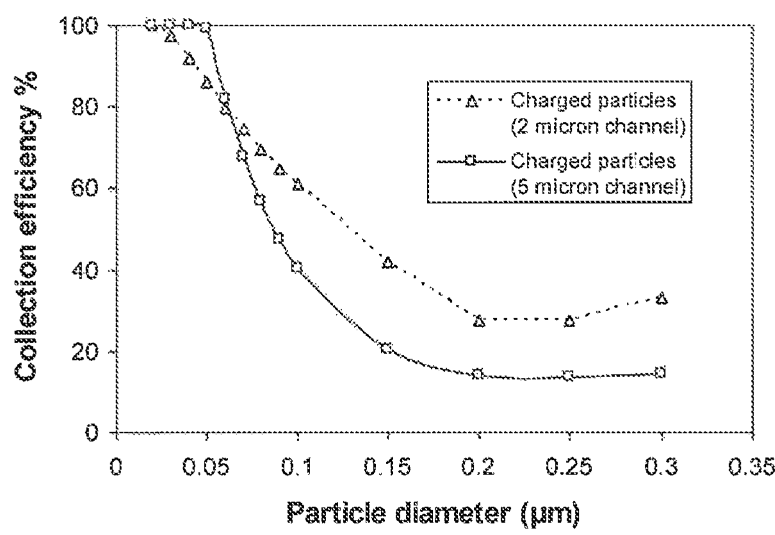
FIG. 18B depicts modeling of collection efficiency for charged particle flow through monolith filters with different channel sizes at V=1 m/s, in accordance with an illustrative embodiment.

FIG. 18A depicts modeling of collection efficiency for charged particles flow through monolith filter with different channel size (V=0.1 m/s). FIG. 18B depicts modeling of collection efficiency for charged particles flow through monolith filter with different channel size (V=1 m/s).

FIG. 18A shows the collection efficiency curves for charged particles flow through monolith filter with different channel sizes under slow flow condition (V=0.1 m/s). The collection efficiency for the monolith filter with 5 μm diameter channels is 100% for particles with a size up to 150 nm, compared to 90 nm for the monolith filter with 2 μm diameter channels. But for larger particles (greater than 250 nm) the collection efficiency is higher for monolith filter with a smaller size channel. Under the condition of higher flow velocity, the trend is similar except that starting from a particle size of 70 nm, the collection efficiency for monolith filter with a smaller size channel is greater than that with a larger size channel, as seen in FIG. 18B.

When the particle size is smaller, the Brownian diffusion and electrostatic force becomes more prominent; as the particle size increases the interception and inertia impaction effects becomes more important. The collection efficiencies for particles of all sizes are due to the combined effects of electrostatic force, Brownian diffusion, inertia impaction and interception mechanisms. For larger channels since the depth of the channel is also larger (25 μm) the travel time in the channel for each particle is also longer, which is in favor of the electrostatic attraction effect, especially for smaller particles. This explains why the collection efficiency of monolith filters with larger channels for smaller particles is higher. In addition, under the same void and total volume ratio, smaller channel size also in favor of the Brownian diffusion and interception effects. As the particle size increases, the electrostatic attraction is weakened, but interception and inertia impaction play more important roles, resulting in larger collection efficiency of monolith filters with smaller channels for larger particles.

Figure 19A:
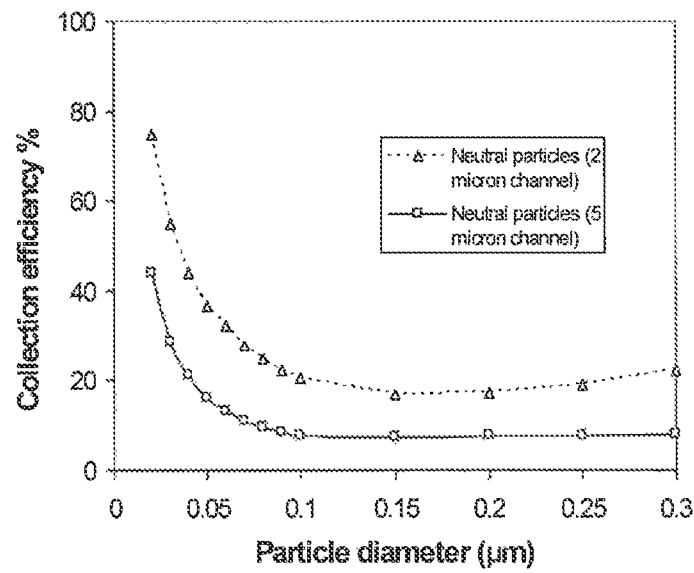
FIG. 19A depicts modeling of collection efficiency for neutral particle flow through monolith filters with different channel sizes at V=0.1 m/s, in accordance with an illustrative embodiment.
Figure 19B:
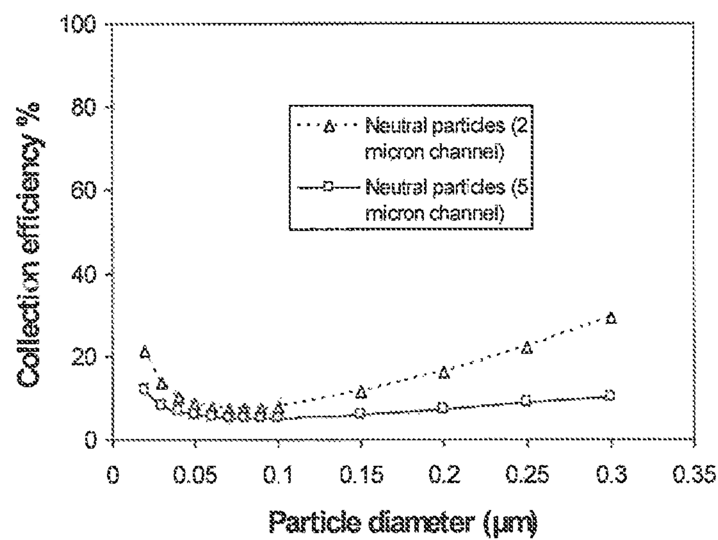
FIG. 19B depicts modeling of collection efficiency for neutral particle flow through monolith filters with different channel sizes at V=1 m/s, in accordance with an illustrative embodiment.

FIG. 19A depicts modeling of collection efficiency for neutral particles flow through monolith filter with different channel size (V=0.1 m/s). FIG. 19B depicts modeling of collection efficiency for neutral particles flow through monolith filter with different channel size (V=1 m/s).

FIG. 19A shows the collection efficiency for neutral particles flow through monolith filter with different channel size under slow flow condition (V=0.1 m/s). The collection efficiency for monolith filter with larger channels is lower for all different sized particles. This is reasonable, since a smaller channel size enhance both the Brownian diffusion and interception particle collection effects. And the difference of collection efficiency is huge for smaller particle (74.9% vs. 44.1% for 20 nm particle) and larger particle (22.4% vs. 8.2 for 300 nm particle). For the cases with the higher flow velocity of V=1 m/s, as shown in FIG. 19B, the trend is the same, except that the collection efficiencies for both cases are smaller than those under the slow flow condition. As the flow velocity increases, the Brownian diffusion effect is weakened; hence the collection efficiency is decreased for all different sized particles.

Particle Deposition

To understand the capture mechanism and hence help design and improve the performance of the monolith filter, the probability of which parts of the filter surface a particle will deposit onto was also studied. Deposition of charged particles on different locations of the monolith filter was modeled under the slow flow conditions, with V=0.1 m/s. A percentage histogram was calculated of charged particles deposited on different locations of the monolith filter under the slow flow conditions. Except for the smallest particles (20 nm), the majority of particles are captured by the front surface. Under slow flow condition, the effect of Brownian motion is important and the particles need longer time to reach the entrance of the channel, which increases the chance of collection of these particles on the front surface. As for the 20 nm size particle, the electrostatic attraction from the charged cylindrical surface is so strong that it overcomes the Brownian diffusion effect; as a consequence, most of the 20 nm particles enter the inner channel and get captured there.

It was also observed that for smaller size particles (less than or equal to 100 nm), the collection ratio on the inner surface is over 30%, and as the particle size further increases, the collection ratio on the inner surface begins to drop. On the other hand the collection ratio on the back surface of the monolith filter increases gradually, because when the particle becomes larger, its chance of flowing out of the channel increases. But even when the particles flow out of the channel, they are still affected by the electrostatic attraction; this increases the chances of particle collection on the back surface of the monolith filter, as seen at 15C of FIG. 15.

Deposition of charged particles on different locations of the monolith filter was also modeled under the fast flow conditions, with V=1 m/s. A percentage histogram was calculated of charged particles deposited on different locations of the monolith filter under fast flow conditions with V=1 m/s. About 87.5% of 20 nm sized particles were found to be captured on the inner channel surface, and the collection ratio on the inner channel surface steadily decreases as the particle size increases. For particles with a size of more than or equal to 150 nm, no particle is actually captured on the inner channel surface. The peak of collection ratio on the front surface is when the particle size reaches 250 nm. The collection ratio on the front surface approaches 100% for particles with a size of 250 nm or 300 nm.

The fast flow condition enhances the inertia impaction collection mechanism, especially for larger particles. Therefore the chance of larger particles being captured on the front surface increases. Also, when these relatively larger sized particles flow out of the channel, the inertia force can overcome the electrostatic attraction and enable these particles to escape the filter. The peak of collection ratio on the back surface is for particles with a diameter of 100 nm. At this size, the drag force can overcome the Brownian diffusion force and electrostatic force and making the particle flow out of the entrance. On the other hand, the drag force is not big enough to carry the all these particles all the way through the filter; the electrostatic attraction plays a critical role in reversing flow direction of these particles after they flow out of the channel and contributing to back surface particle collection.

Conclusions

The collection efficiency of nanoparticles for electrostatically charged monolith filters with array of micron sized channels was investigated. Two monolith filters with different sized channels were considered: one with 2 μm channel diameter, and the other with 5 μm channel diameter. The flow fields for the representative domains were obtained by using the Lattice Boltzmann method along with the first order slip boundary condition. Upon computing the realistic electric field in the computational domain, a parametric study was performed by considering the electric fields of up to 225 neighbor channels. To calculate the collection efficiency of the monolith filer, four main collection mechanisms were modeled in the calculations: electrostatic attraction, Brownian diffusion, interception and inertia compaction were taken into account in the computation.

It was concluded that the electrostatic force is a crucial factor that affects the collection efficiency of charged monolith filters, especially under slow flow conditions. At a slow flow velocity of 0.1 m/s, the collection efficiencies for both monolith filters with 2 μm and 5 μm sized channels for charged particles with a diameter less than 200 nm are above 90%. Under the fast flow condition (V=1 m/s), the collection efficiencies of both filters for charged particles less than 60 nm are above 80%. These results indicate that the monolith filter is a promising type of filter for capturing electrostatically charged nanoparticles. The collection efficiencies for the neutral particles are lower compared to those for the charged particles, and the curves shows the typical "U" shapes. For smaller size neutral particles, the Brownian diffusion is the dominant collection mechanism, especially in slower flow field. For larger particles, the inertia impaction becomes more important and this effect is more prominent at higher flow velocity. These two mechanisms contribute the two higher ends in the "U" shape curve.

A numerical study on the deposition of particles on different parts of the monolith filter also discovered that if both filter and particles are in opposite charge, the back surface collection is non-negligible; under certain circumstances, it may be of comparable importance as the front surface and inner channel surface collections.

Section III

REFERENCES

Abuzeid, S., Busnaina, A. A. and Ahmadi, G. (1991). Wall deposition of aerosol particles in a turbulent channel flow. *J. Aerosol Sci.* 22, 43-62.

Ansumali, S. and Karlin, I. V. (2002). Kinetic boundary condition in the lattice Boltzmann method, *Phys. Rev. E* 66 026311.

Bird, G. A. (1994) *Molecular gas dynamics and the direct simulation of gas flows*. Clarendon Press, Oxford.

Burnett D. (1935). The distribution of velocities and mean motion in a slight nonuniform gas, *Prod. London Math. Soc.* 39 385-430.

Cao, Y. H., Cheung, C. S. and Yan, Z. D. (2004) Numerical Study of an Electret Filter Composed of an Array of Staggered Parallel Rectangular Split-Type Fibers, *Aerosol Science and Technology,* 38, 603-618.

Chen, S., Chen, H., Martinez, D. and Matthaeus, W., (1991). Lattice Boltzmann model for simulation of magnetohydrodynamics, *Phys. Rev. Lett.* 67, 3776-3780.

Chen, S., Doolen, G. D., (1998). Lattice Boltzmann method for fluid flow, *Ann. Rev. Fluid Mech.* 1998, 30, 329-364.

Chen, S., Cheung, C. S., Chan, C. K. and Zhu, C. (2002). Numerical Simulation of Aerosol Collection in Filters with Staggered Parallel Rectangular Fibers, *Computational Mechanics,* 28, 152-161.

Fardi, B. and Liu, B. Y. H. (1992a). Flow field and pressure drop of filters with rectangular fibers. *Aerosol Science and Technology,* 17, 36-44.

Fardi, B. and Liu, B. Y. H. (1992b). Efficiency of fibrous filters with rectangular fibers. *Aerosol Science and Technology,* 17, 45-58

Fleischer R. L., Price P. B., and Walker R. M., University of California Press, Berkeley (1975).

Gad-el-Hak, M. (1999). The fluid mechanics of microdevices—The Freeman Scholar Lecture. *Trans. ASME, J. Fluids Engineering,* 121, 5-33.

Iwan D. W. and Mason, B. A. Jr., (1980). Equivalent linearization for systems subjected to non-stationary random excitation. *Int. J. Non-Linear Mech.* 15. 71-82.

Karniadakis, E. M. and Beskok, A. (2002). Micro Flows. Fundamentals and Simulation. Springer.

Kim, S., Harrington, M., Pui, D. (2007). Experimental study of nanoparticles penetration through commercial filter media. *Journal of Nanoparticle Research,* 9, 117-125.

Kim, M.-M. and Zydney, A. L. (2004) Effect of electrostatic, hydrodynamic, and Brownian forces on particle trajectories and sieving in normal flow filtration. *J. Colloid Interface Sci.* 269, 425-431.

Kim, M.-M. and Zydney, A. L. (2006) Theoretical analysis of particle trajectories and sieving in a two-dimensional cross-flow filtration system. *J. Membr. Sci.* 281, 666-675.

Ming O, Y. and Liu B. Y. H. (1998). Analytical solution of flow field and pressure drop for filters with rectangular fibers. *J. Aerosol Science,* 29, 187-196.

Oberdörster, G., Maynard, A., Donaldson, K., Castranova, V., Fitzpatrick, J., Ausman, K., Carter, J Karn, B., Kreyling, W., Lai, D., Olin, S., Monteiro-Riviere, N., Warheit, D., Yang, H. (2005). Principles for characterizing the potential human health effects from exposure to nanomaterials: elements of a screening strategy, *Particle and Fibre Toxicology* 2: 8

Orabi, I. I., and Ahmadi, G., (1987) Nonstationary response analysis of a duffing oscillator by the Wiener-Hermite expansion method. *J. Appl. Mech.* 1987, 54 434-440.

Qian, Y., d'Humières, D. and Lallemand, P., (1992). Lattice BGK Models for Navier-Stokes Equation, *Europhys. Lett.* 17, 479-484.

Schaaf, S. A. and Chambre, P. L. (1961). *Flow of rarefied gases*. Princeton University Press.

Sofonea, V. and Sekerka, R. F. (2005). Boundary conditions for the upwind finite difference lattice Boltzmann model: Evidence of slip velocity in micro-channel flow, *J. Comp. Phys.* 207 639-659.

Sone, Y. (2002) *Kinetic theory and fluid dynamics*. Birkhäuser, Boston.

Succi, S. (2001). The Lattice Boltzmann Equation for Fluid Dynamics and Beyond, Oxford University Press, Oxford.

Wang, J. and Pui, D. Y. H. (2009) Filtration of aerosol particles by elliptical fibers: a numerical study, *Journal of Nanoparticle Research,* 11 185-196.

Wu M., Kuznetsov A. V. and Jasper W. J. (2010) Modeling of particle trajectories in an electrostatically charged channel, *Physics of Fluids,* 22 043301

Yun, K. M., Hogan Jr., C. J., Matsubayashi, Y., Kawabe, M., Iskandar, F., Okuyama, K. (2007). Nanoparticle filtration by electrospun polymer fibers, *Chemical Engineering Science* 62 4751-4759.

Zhu, C., Lin, C. H., and Cheung C. S. (2000) Inertia impaction dominated fibrous filtration with rectangular or cylindrical fibers. *Powder Technology,* 112, 149-162

Zhu, H. and Hinestroza, J. P. (2009). Collection Efficiency for Filters with Staggered Parallel Y and Triple Y Fibers: A Numerical Study, *Journal of Engineered Fibers and Fabrics,* 4, 16-25.

Zypmana, F. R. (2006) Off-axis electric field of a ring of charge, *Am. J. Phys.* 74 (4) 295-300.

An illustrative collection of examples of inventive concepts of the present disclosure may thereby be provided as follows:

A1. A method comprising:

forming a pattern of features on a wafer, thereby forming a patterned wafer;

forming a polymer layer on the patterned wafer;

using a first plasma to remove at least a portion of the polymer layer; and using a second plasma to remove at least a portion of the pattern of features, thereby providing a structured polymer monolith.

A2. The method of A1, in which the pattern of features comprises an array of pillars, and in which providing the structured polymer monolith comprises providing a structured polymer monolith filter having an array of channels formed by etching away of the pillars.

A3. The method of A1, in which the structured polymer monolith is composed of a thermoplastic polyolefine.

A4. The method of A3, in which the structured polymer monolith is composed of polypropylene.

A5. The method of A1, in which forming the polymer layer on the patterned wafer comprises spin-coating a polymer solution onto the patterned wafer.

A6. The method of A5, in which the polymer solution is a polypropylene solution.

A7. The method of A1, in which forming the pattern of features on the wafer comprises:

applying a photoresist to the wafer;

shining electromagnetic radiation through a patterned photomask at the wafer;

applying a photoresist developer to the wafer; and etching the wafer.

A8. The method of A1, in which the first plasma comprises an oxygen plasma.

A9. The method of A1, in which the second plasma comprises a silicon etchant plasma.

A10. The method of A9, in which the silicon etchant plasma comprises a sulfur hexafluoride plasma.

A11. The method of A1, further comprising applying an electrostatic charge to the structured polymer monolith.

A12. A monolith filter, comprising:

a front surface;

a back surface;

an array of channels, having a diameter of less than or equal to ten microns, extending from the front surface through to the back surface;

in which the channels are arranged in a regular pattern in the monolith filter; and in which the monolith filter is mainly composed of at least one polymer.

A13. The monolith filter of A12, in which the regular pattern the channels are positioned in comprises a grid pattern.

A14. The monolith filter of A12, in which at least a portion of the channels have a diameter of between three and seven microns.

A15. The monolith filter of A12, in which at least a portion of the channels have a diameter of between one and three microns.

A16. The monolith filter of A12, in which the at least one polymer comprises polypropylene.

A17. The monolith filter of A12, in which the monolith filter has an electrostatic charge.

A18. A method for fabricating a polypropylene monolith filter comprising an array of microscopic channels, the method comprising:

preparing a patterned photomask configured with an array of dots;

applying a photoresist to a wafer;

shining ultraviolet radiation through the patterned photomask at the wafer;

applying a photoresist developer to the wafer;

etching the wafer, thereby forming a patterned wafer having an array of pillars, corresponding to the array of dots in the patterned photomask, in which the pillars have a diameter of ten microns or less;

spin-coating a polypropylene solution onto the patterned wafer, thereby forming a polypropylene layer on the patterned wafer;

using an oxygen plasma to remove a portion of the polypropylene layer from the patterned wafer, thereby re-exposing at least some of the pillars;

using a silicon etchant plasma to etch away the pillars, thereby providing a polypropylene monolith filter having an array of channels defined where the pillars had been etched away, the channels having a diameter of ten microns or less, and the polypropylene monolith filter having a thickness of 50 microns or less; and removing the polypropylene monolith filter from the wafer.

A19. The method of A18, in which the silicon etchant plasma comprises sulfur hexafluoride.

A20. The method of A18, further comprising using a corona charging process to apply an electrostatic charge to the polypropylene monolith filter.

While the present disclosure has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than or more than the mentioned certain number of elements. Also, while a number of particular embodiments have been described, it will be understood that features and aspects that have been described with reference to each particular embodiment can be used with each remaining particularly described embodiment.

While various embodiments have been particularly shown and described, it will be understood by those skilled in the art that various combinations of the disclosed elements or changes in detail may be made without departing from the spirit and scope of the claims. Many variations may also be made within the realm of different embodiments, limited only by the scope of the claims as recited below.

What is claimed is:

1. A method comprising:

forming a pattern of features on a wafer, thereby forming a patterned wafer;

forming a polymer layer on the patterned wafer;

using a first plasma to remove at least a portion of the polymer layer; and using a second plasma to remove at least a portion of the pattern of features, thereby providing a structured polymer monolith.

2. The method of claim 1, in which the pattern of features comprises an array of pillars, and in which providing the structured polymer monolith comprises providing a structured polymer monolith filter having an array of channels.

3. The method of claim 1, in which the structured polymer monolith is composed of a thermoplastic polyolefine.

4. The method of claim 3, in which the structured polymer monolith is composed of polypropylene.

5. The method of claim 1, in which forming the polymer layer on the patterned wafer comprises spin-coating a polymer solution onto the patterned wafer.

6. The method of claim 5, in which the polymer solution is a polypropylene solution.

7. The method of claim 1, in which forming the pattern of features on the wafer comprises:

applying a photoresist to the wafer;

shining electromagnetic radiation through a patterned photomask at the wafer;

applying a photoresist developer to the wafer; and etching the wafer.

8. The method of claim 1, in which the first plasma comprises an oxygen plasma.

9. The method of claim 1, in which the second plasma comprises a silicon etchant plasma.

10. The method of claim 9, in which the silicon etchant plasma comprises a sulfur hexafluoride plasma.

11. The method of claim 1, further comprising applying an electrostatic charge to the structured polymer monolith.

12. A method for fabricating a polypropylene monolith filter comprising an array of microscopic channels, the method comprising:

preparing a patterned photomask configured with an array of dots;

applying a photoresist to a wafer;

shining ultraviolet radiation through the patterned photomask at the wafer;

applying a photoresist developer to the wafer;

etching the wafer, thereby forming a patterned wafer having an array of pillars, corresponding to the array of dots in the patterned photomask, in which the pillars have a diameter of ten microns or less;

spin-coating a polypropylene solution onto the patterned wafer, thereby forming a polypropylene layer on the patterned wafer;

using an oxygen plasma to remove a portion of the polypropylene layer from the patterned wafer, thereby re-exposing at least some of the pillars;

using a silicon etchant plasma to etch away the pillars, thereby providing a polypropylene monolith filter having an array of channels defined where the pillars had been etched away, the channels having a diameter of ten microns or less, and the polypropylene monolith filter having a thickness of 50 microns or less; and removing the polypropylene monolith filter from the wafer.

13. The method of claim 12, in which the silicon etchant plasma comprises sulfur hexafluoride.

14. The method of claim 12, further comprising using a corona charging process to apply an electrostatic charge to the polypropylene monolith filter.

* * * * *